(12) United States Patent
Shafer et al.

(10) Patent No.: US 6,665,126 B2
(45) Date of Patent: Dec. 16, 2003

(54) PROJECTION EXPOSURE LENS WITH ASPHERIC ELEMENTS

(75) Inventors: David R. Shafer, Fairfield, CT (US); Wilhelm Ulrich, Aalen-Dewangen (DE); Helmut Beierl, Heidenheim (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/751,352

(22) Filed: Dec. 27, 2000

(65) Prior Publication Data

US 2002/0039175 A1 Apr. 4, 2002

Related U.S. Application Data

(60) Provisional application No. 60/173,523, filed on Dec. 29, 1999, and provisional application No. 60/222,798, filed on Aug. 2, 2000.

(51) Int. Cl.[7] .............................. G02B 9/00; G02B 17/00
(52) U.S. Cl. ........................ 359/649; 359/726; 359/732
(58) Field of Search .................................. 359/649–651, 359/726, 727, 732

(56) References Cited

U.S. PATENT DOCUMENTS

| | | | | |
|---|---|---|---|---|
| 4,953,960 A | * | 9/1990 | Williamson | 359/663 |
| 5,220,454 A | * | 6/1993 | Ichihara et al. | 359/487 |
| 5,289,312 A | * | 2/1994 | Hashimoto et al. | 359/487 |
| 5,694,241 A | * | 12/1997 | Ishiyama et al. | 359/364 |
| 5,861,997 A | * | 1/1999 | Takahashi | 359/727 |
| RE36,740 E | * | 6/2000 | Ishihara et al. | 359/487 |
| 6,081,382 A | * | 6/2000 | Omura | 359/629 |
| 6,195,213 B1 | * | 2/2001 | Omura et al. | 359/727 |
| 6,496,306 B1 | * | 12/2002 | Shafer et al. | 359/355 |

* cited by examiner

*Primary Examiner*—Loha Ben
*Assistant Examiner*—William Choi

(57) ABSTRACT

A projection exposure lens has an object plane, optical elements for separating beams, a concave mirror, an image plane, a first lens system arranged between the object plane and the optical elements for separating beams, a second double pass lens system arranged between the optical elements for separating beams and the concave mirror, a third lens system arranged between the optical elements for separating beams and the image plane. The second lens system has a maximum of five lenses.

78 Claims, 11 Drawing Sheets

PROJECTION EXPOSURE LENS WITH ASPHERIC ELEMENTS

CROSS-REFERENCES TO RELATED APPLICATIONS

This application claims the benefit of provisional applications 60/173,523 filed Dec. 29, 1999 and 60/222,798 filed Aug. 2, 2000.

STATEMENT REGARDING FEDERALLY-SPONSORED RESEARCH/DEVELOPMENT

Not Applicable.

1. FIELD OF THE INVENTION

The present invention relates to a projection exposure lens in a projection exposure apparatus such as a wafer scanner or a wafer stepper used to manufacture semiconductor elements or other microstructure devices by photolithography and, more particularly, to a catadioptric projection optical lens with an object side catadioptric system and a refractive system for use in such a projection exposure apparatus.

2. RELATED BACKGROUND ART

U.S. Pat. No. 4,779,966 to Friedman gives an early example of such a lens, however the catadioptric system being arranged on the image side. Its development starting from the principle of a Schupmann achromat is described. It is an issue of this patent to avoid a second lens material, consequently all lenses are of fused silica. Light source is not specified, band width is limited to 1 nm.

U.S. Pat. No. 5,052,763 to Singh (EP 0 475 020) is another example. Here it is relevant that odd aberrations are substantially corrected separately by each subsystem, wherefore it is preferred that the catadioptric system is a 1:1 system and no lens is arranged between the object and the first deflecting mirror. All examples provide only fused silica lenses. NA is extended to 0.7 and a 248 nm excimer laser or others are proposed. Line narrowing of the laser is proposed as sufficient to avoid chromatic correction by use of different lens materials.

U.S. Pat. No. 5,691,802 to Takahashi is another example, where a first optical element group having positive refracting power between the first deflecting mirror and the concave mirror is requested. This is to reduce the diameter of the mirror, and therefore this positive lens is located near the first deflecting mirror. All examples show a great number of $CaF_2$ lenses.

EP 0 736 789 A to Takahashi is an example, where it is requested that between the first deflecting mirror and the concave mirror three lens groups are arranged, with plus minus plus refractive power, also with the aim of reducing the diameter of the concave mirror. Therefore, the first positive lens is located rather near to the first reflecting mirror. Also many $CaF_2$ lenses are used for achromatization.

DE 197 26 058 A to Omura describes a system where the catadioptric system has a reduction ratio of $0.75 \leq \beta_1 < 0.95$ and a certain relation for the geometry of this system is fulfilled as well. Also many $CaF_2$ lenses are used for achromatization.

For purely refractive lenses of microlithography projection exposure system a lens design where the light beam is twice widened strongly is well known, see e.g. Glatzel, E., Zeiss-Information 26 (1981), No. 92, pages 8–13. A recent example of such a projection lens with +−+−+ lens groups is given in EP 0 770 895 to Matsuzawa and Suenaga.

The refractive partial objectives of the known catadioptric lenses of the generic type of the invention, however, show much simpler constructions.

A catadioptric projection exposure lens comprising lenses or mirrors which are aspheric are known from JP 10-10429 and EP 0 869 383.

According to JP 10-10429 the aspheric surface is placed in the vicinity of a reflecting mirror.

By placing the aspheric surface in vicinity of the reflecting mirror, a good correction of distortions is achieved. Furthermore the system according to JP 10-10429 comprises an intermediate image.

From EP 0 869 383 a catadioptric system comprising at least two aspheric surfaces is known. For correcting off-axis-aberration one of the aspheric surfaces satisfies the condition $$h/\phi < 0.85$$

and for correcting on-axis-aberration the other of the aspheric surfaces satisfies the condition $$0.85 < h/\phi < 1.2$$

whereby h is the height at each lens surface of the light beam that is assumed to be emitted from the intersection of the optical axis and the object plane and passes through the lens surfaces with the maximum numerical aperture NA and $\phi$ is the radius of the diaphragm of the aperture stop. Subject matter of EP 0 869 383 therefore is to ensure a high image quality by using aspheric surfaces.

Only as a point amongst others EP 0 869 383 mentions that by using aspheric surfaces the number of lenses in a catadioptric system can be decreased. Furthermore EP 0 869 383 relates only to systems with an intermediate image. As special embodiments EP 0 869 383 shows systems with the first aspheric surface placed near the intermediate image while the second aspheric surface is placed near the concave mirror of the catadioptric system or near the aperture stop.

WO 99/52004 shows embodiments of catadioptric objectives with few lenses, some of them being aspheric. From WO 99/52004 a system with 16 lenses, at least four of them being aspheric lenses and a numerical aperture of 0.65 is known.

From E. Heynacher, Zeiss-Information 24, pp. 19–25 (1978/79), Heft 88, it is known that with complicated optical systems it is less appropriate to treat imaging errors separately by aspheres, but to influence the correction of the imaging errors as a whole.

3. SUMMARY OF THE INVENTION

It is an object of the present invention to obtain a catadioptric optical system of new construction principles allowing for large numerical aperture, large image field, sufficient laser bandwidth, solid and stable constructions, which takes into account the present limitations on availability of $CaF_2$ in quantity and quality. Therefore it is the major object of the present invention to minimize the number of lenses in a projection exposure lens for DUV (193 nm) and VUV (157 nm) systems. Furthermore said systems should not be restricted to systems with an intermediate image.

In order to achieve the above object, according to the present invention, there is provided a projection exposure lens according to claim 1.

It is a further object of the invention by minimizing the number of lenses to reduce the absorption and the reflection losses of the whole projection exposure lens.

Said further object is achieved by reducing the number of lenses in the second double passed lens system of the projection exposure lens since in the double passed lens system undesirable effects of absorption in the lens material and of reflection losses at the surface count twice.

According to the invention the second lens system comprises at maximum five lenses, preferably two or three lenses.

In a preferred embodiment of the invention negative refraction power is arranged in the second lens system between the optical elements for splitting beam and the concave mirror. Said negative refraction power is split into advantageously two negative lenses.

In a further preferred embodiment for correcting the chromatic length aberration CHL the second lens system provides for a over correction while the first and third lens system provides for a under correction.

The long drift section in the second lens system according to the invention provides for several advantages:

Mounting of the lens components in the second lens system is less complicated than in objectives known from the prior art.

The lenses of the second lens system and the concave mirror could be mounted as a separate lens group, no metallic tube is necessary between the optical elements for splitting beam and the first lens of the second lens system.

Further advantageous embodiments are obtained when including features of one or more of the dependent claims 4 to 61.

An advantageous projection exposure apparatus of claim 62 is obtained by incorporating a projection exposure lens according to at least one of claims 1 to 61 into a known apparatus.

A method of producing microstructured devices by lithography according to the invention is characterized by the use of a projection exposure apparatus according to the preceding claim 62. Claim 63 gives an advantageous mode of this method.

The present invention will be more fully understood from the detailed description given hereinbelow and the accompanying drawings, which are given by way of illustration only and are not to be considered as limiting the present invention. Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

4. BRIEF DESCRIPTION OF THE DRAWINGS

First a projection exposure apparatus in which an projection exposure lens according to the invention could be used is described without showing a figure thereof. A projection exposure apparatus includes for example an excimer laser light source with an arrangement moderately narrowing bandwidth. An illumination system produces a large field, sharply limited and illuminated very homogeneously, which matches the telecentricity requirements of the projection lens, and with an illumination mode to choice. Such mode may be conventional illumination of variable degree of coherence, annular or quadrupole illumination.

A mask or a reticle is displaced in the illuminated area by a mask resp. reticle holding and handling system which includes the scanning drive in case of a wafer scanner projection exposure apparatus. Subsequently follows the projection exposure lens according to the invention to be described in detail subsequently.

The projection exposure lens produces a reduced scale image of the mask on a wafer. The wafer is held, handled and eventually scanned by a scanning unit.

All systems are controlled by control unit. Such unit and the method of its use is known in the art of microlithographic projection exposure.

However, for exposure of structures in the regime of about 0.2 $\mu$m and less resolution at high throughput there is a demand for various projection exposure lenses capable to be operated at 193 nm, eventually also at 248 nm or 157 nm excimer laser wavelengths with reasonably available bandwidths (e.g. 15 pm at 193 nm), at high image side numerical aperture of 0.65 to 0.8 or more and with reasonably large rectangular or circular scanning image fields of e.g. 7×20 to 10×30 mm$^2$.

This design concept can be easily modified for 126 nm wavelength with appropriate lens material, e.g. LiF.

Systems according to the state of the art cited above are in principle suitable for this.

However, according to the invention a number of measures and features has been found to improve these systems.

Figure 1:
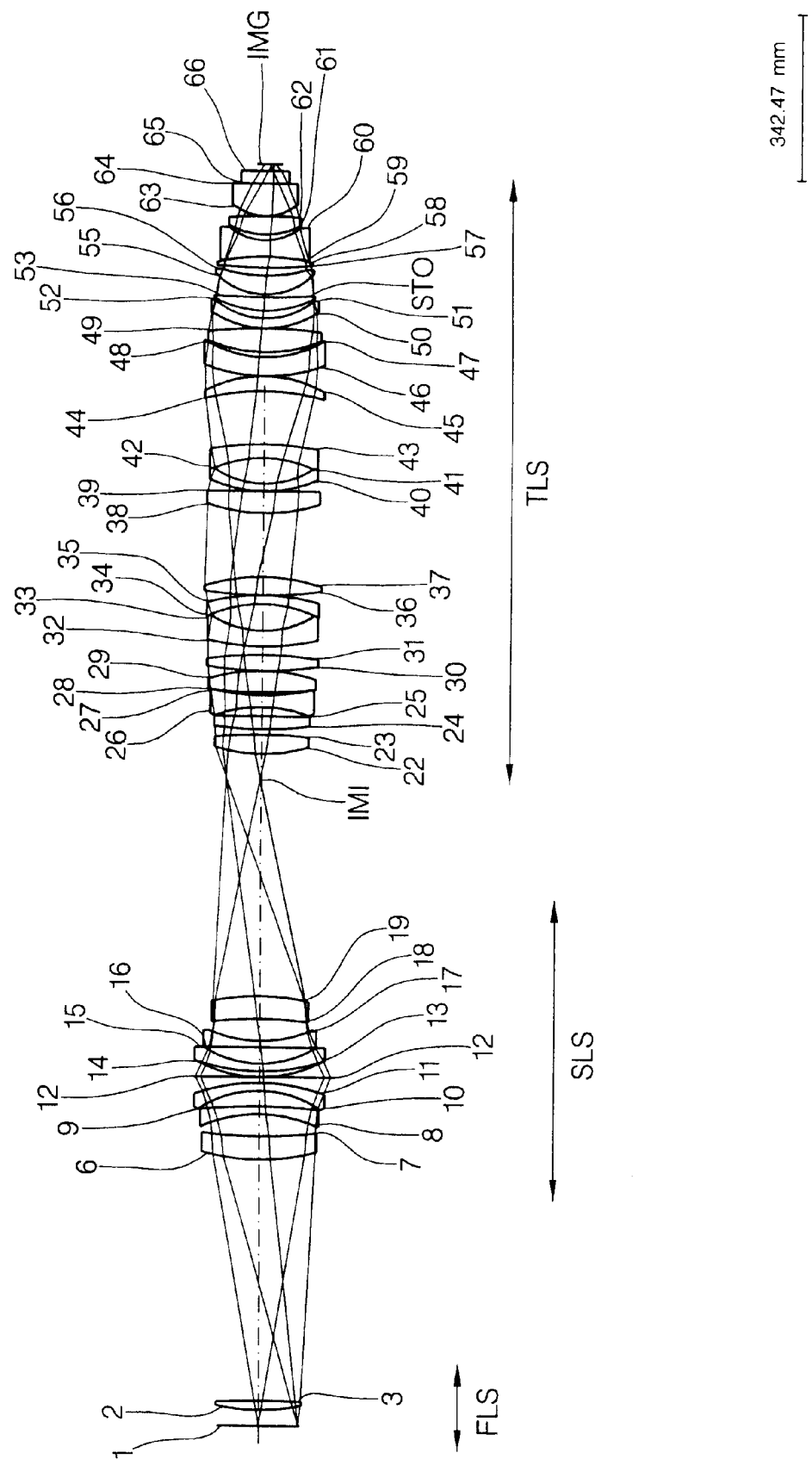
FIG. 1 is a section view of the lens arrangement of a first embodiment.

The example shown in the sectional view of FIG. 1 has the lens data given in Table 1 in code-V-format in the annex and makes use only of fused silica lenses. As only one lens material is used, this design can easily be adapted for other wavelengths as 248 nm or 157 nm. The numbers for the objects in table 1 are identical to the reference signs in FIG. 1.

The intermediate image IMI is freely accessible, so that it is easily possible to insert a field stop. The aperture stop STO is also well accessible.

The splitting of the beam in the catadioptric system is not shown in the embodiments depicted in FIGS. 1–7. Beam splitting can be achieved e.g. by a physical beam splitter, e.g. a beam splitter prism as disclosed in U.S. Pat. No. 5,742, 436. The content of this document is enclosed fully herewith.

An alternative is the usage of deflecting mirrors. In such an embodiment the deflecting mirrors in the catadioptric system are defined in their geometry by the demands of separation of the light beams to and from the concave mirror 12 and of clearance from the lenses.

The arrangement of two deflection mirrors allows for a straight optical axis and parallel situation of origin plane 0 and image plane IMG, i.e. mask resp. reticle and wafer are parallel and can easily be scanned. However, one of the deflecting mirrors can be abandoned or eventually be replaced by a deflecting mirror in the third lens system TLS which is a refractive lens. It is also clear that the deflecting mirrors can be replaced by other deflecting optical elements, e.g. prisms.

A moderate positive lens comprising surfaces 2, 3 is placed near the origin plane 1 in the first lens system FLS, which is a single beam area. Its focal length is approximately equal to its distance from the concave mirror 13.

This makes that the concave mirror 13 is situated in a pupil plane and thus the diameter required is minimized.

A further positive lens is located as a first lens with surfaces 6, 7 in the second doubly passed lens system SLS consisting of three lenses with surfaces 6, 7, 8, 9, 10, 11. As the production conditions of concave mirrors of 200 mm to 300 mm diameter give no strong preference to smaller units in contrast to lenses, namely such made from $CaF_2$, where inhomogeneties etc. give strong limitations—there is no need to use this positive lens with surfaces 6, 7 for reduction of the radius of the concave mirror 100.

The two negative lenses with surfaces 8, 9, 10, 11 of the second lens system SLS cooperate with the concave mirror 13 in a known manner, giving increased angles of incidence and stronger curvature, thus stronger correcting influence of the concave mirror 13.

It is significant, that the number of lenses in the doubly passed area of the catadioptric system is restricted to a low number, e.g. three as in this embodiment, since in this part of the optical system every lens counts double with respect to system energy transmission and wavefront quality degradation—without giving more degrees of freedom for correction.

The embodiment according to FIG. 1 comprises only one aspheric surface 9, 16 in the double passed second lens system SLS of the projection exposure lens. The aspheric surface 9, 16 is situated on the wafer or image IM-side of the lens comprising said surface.

At the intermediate image plane IMI preferably a field stop is inserted, which reduces stray light favourably.

The third lens system TLS following the intermediate image IMI is in principle known from the art. In the embodiment shown the third lens system does not comprise any aspheric surface. The details of the design are given in table 1 in code V-format in the annex of the application.

The example of the invention according to FIG. 1 with an image side NA=0.70 is suitable for printing microstructures at a resolution of less than 0.2 μm over an image field of 30×7 $mm^2$ rectangle at 6 mm off axis, with an excimer laser source of 0.015 rim bandwidth.

Figure 2:
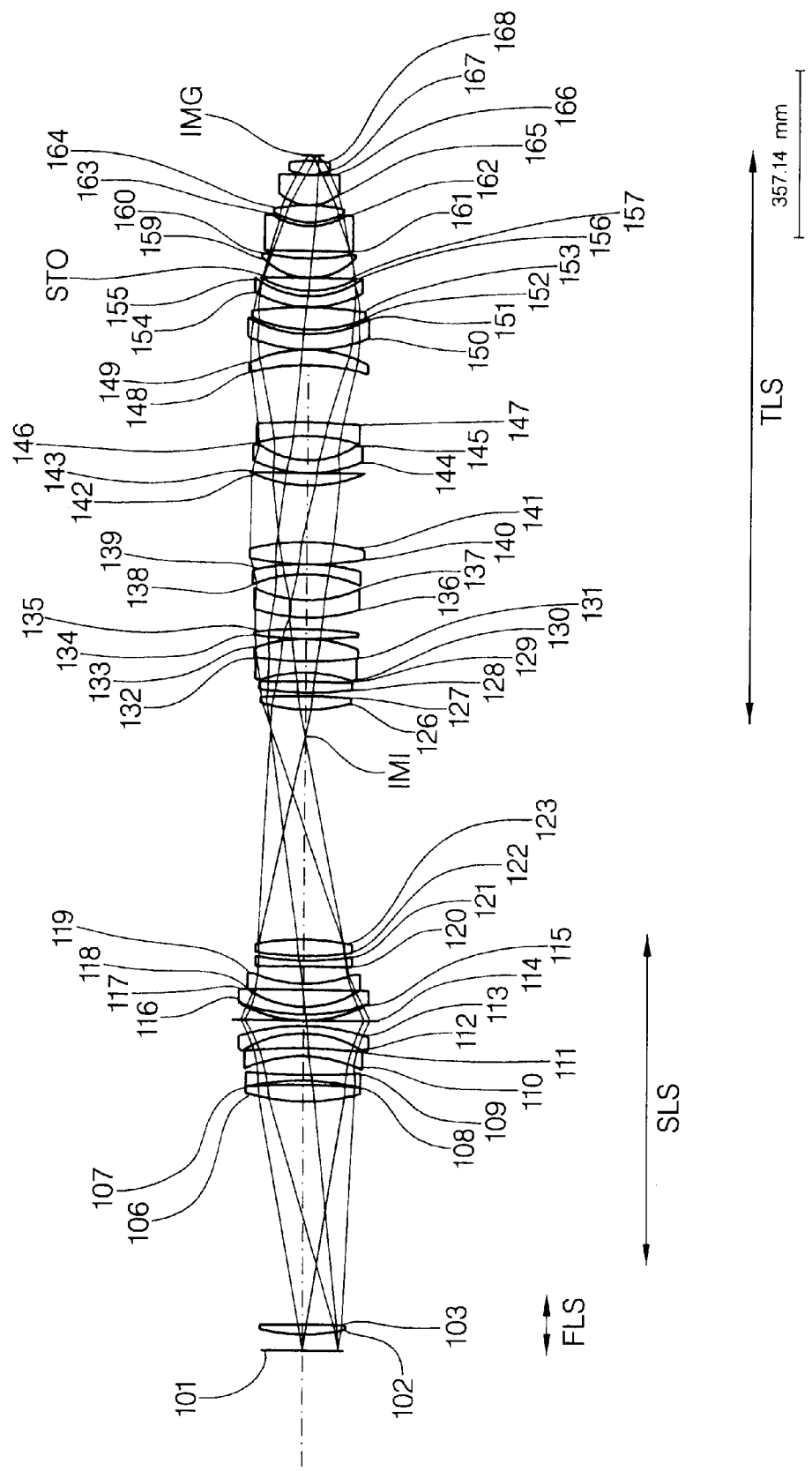
FIG. 2 is a section view of the lens arrangement of a second embodiment.

FIG. 2 and table 2 show a design variant. The second lens system SLS comprises in total four lenses with surfaces which are passed twice. In contrast to the embodiment according to FIG. 1 the aspheric surface 160 is situated in the third lens system TLS facing towards the image IMG resp. the wafer. The details of this embodiment are given in table 2 in code-V-format in the annex. The numbers for the objects in table 2 are identical to the reference signs in FIG. 2.

Figure 3:
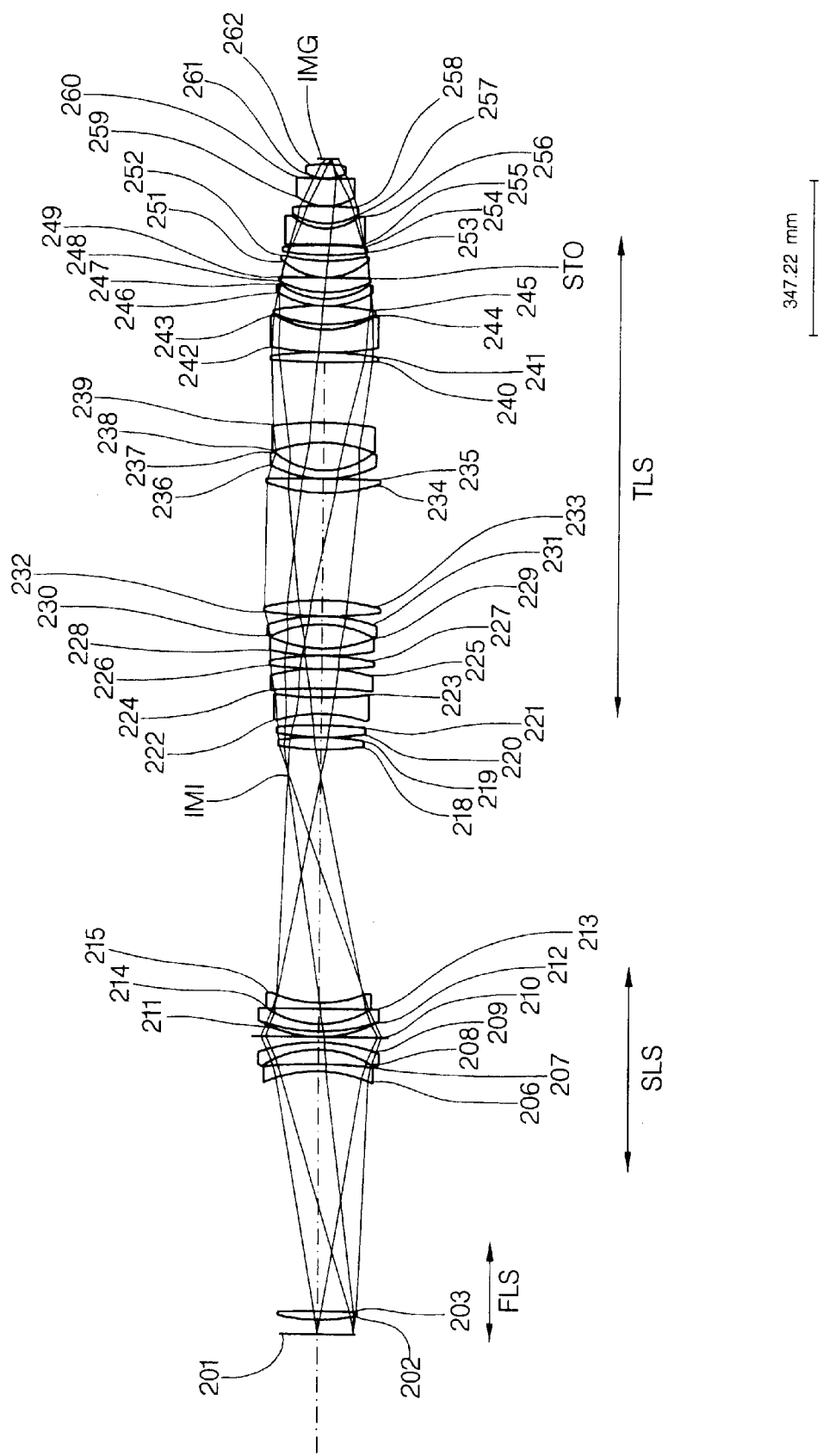
FIG. 3 is a section view of the lens arrangement of a third embodiment.
Figure 4:
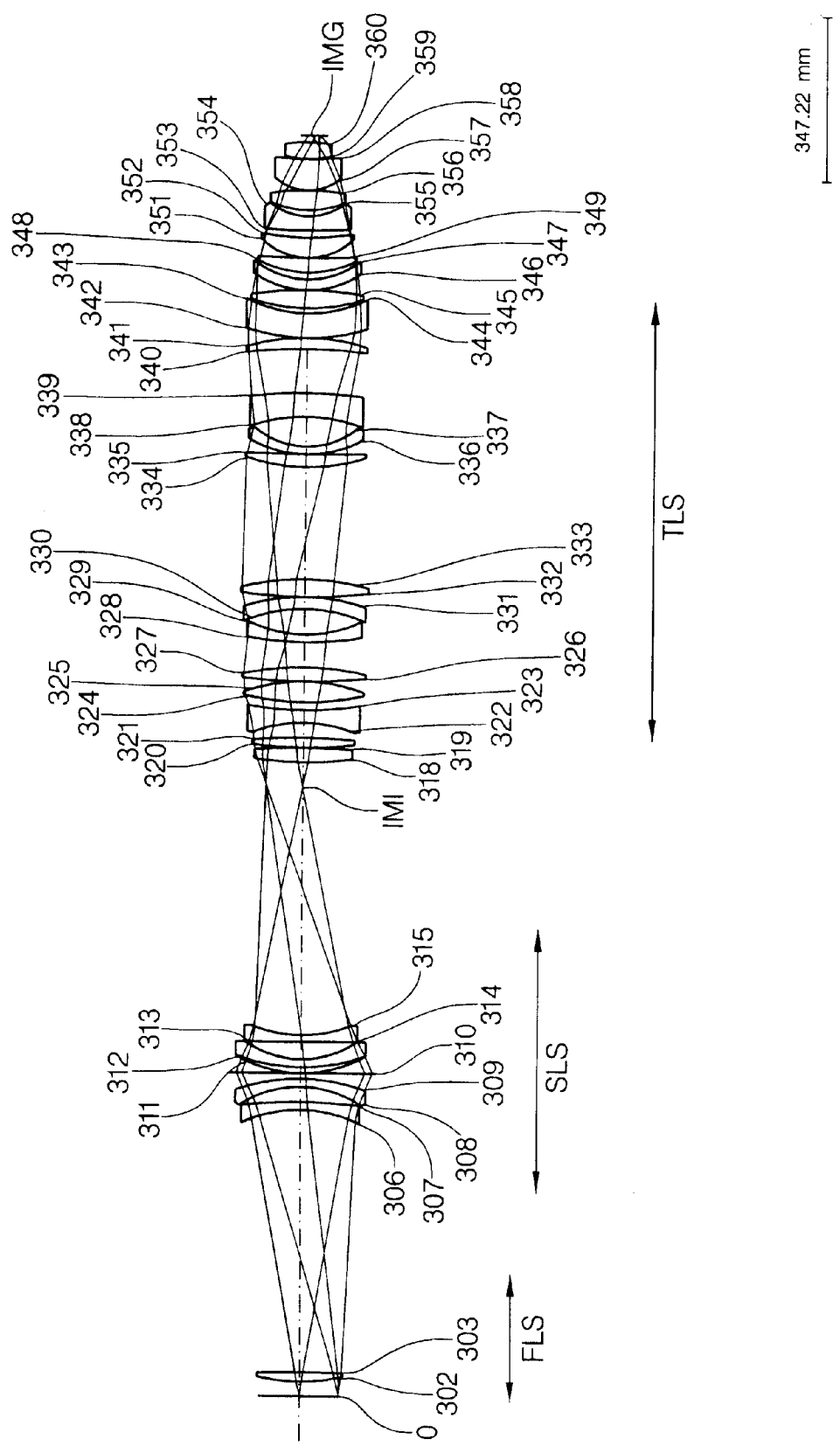
FIG. 4 is a section view of the lens arrangement of a fourth embodiment.

FIGS. 3 and 4 and tables 3 and 4 in the annex show other examples of a projection exposure lens according to the invention. As in the antecedent example, all have an image side NA=0.70. Furthermore the number of the objects in table 3 and 4 correspond to the reference numbers in the FIGS. 3 and 4.

Now, the catadioptric system comprising the second lens system and the concave mirror shows a major revision, since the aspheric surface is situated on the concave mirror 211. This allows for reducing the number of lenses in the catadioptric system to a total number of three. Only the two negative lenses with surfaces 206, 207, 208, 209 have to be passed twice.

In the embodiment according to FIG. 3 the projection exposure lens comprises only one aspheric surface, whereas in the embodiment according to FIG. 4 a further aspheric surface is situated in the third lens system TLS. The further aspheric surface in the third lens system faces towards the image IMG resp. the wafer. The details of these embodiments are given in Tables 3 and 4 in code-V-format in the annex.

Figure 5:
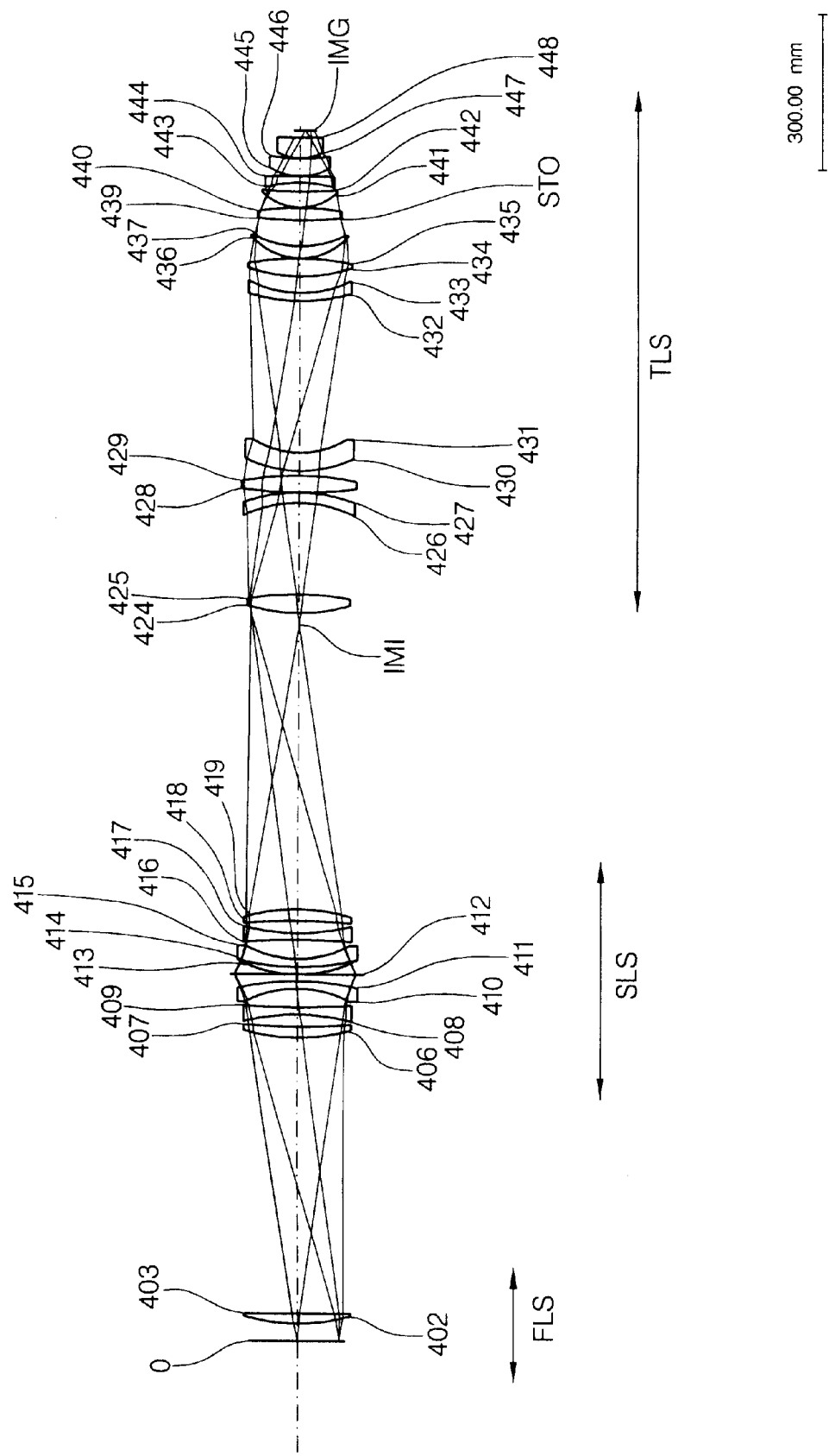
FIG. 5 is a section view of the lens arrangement of a fifth embodiment.

A fifth embodiment is given in FIG. 5 and table 5.

Now, aspheric surfaces are situated only in the third lens system.

Details of the system are given in Table 5 in code-V-format in the annex. The number of the objects in table 5 correspond to the reference number in FIG. 5.

Figure 6:
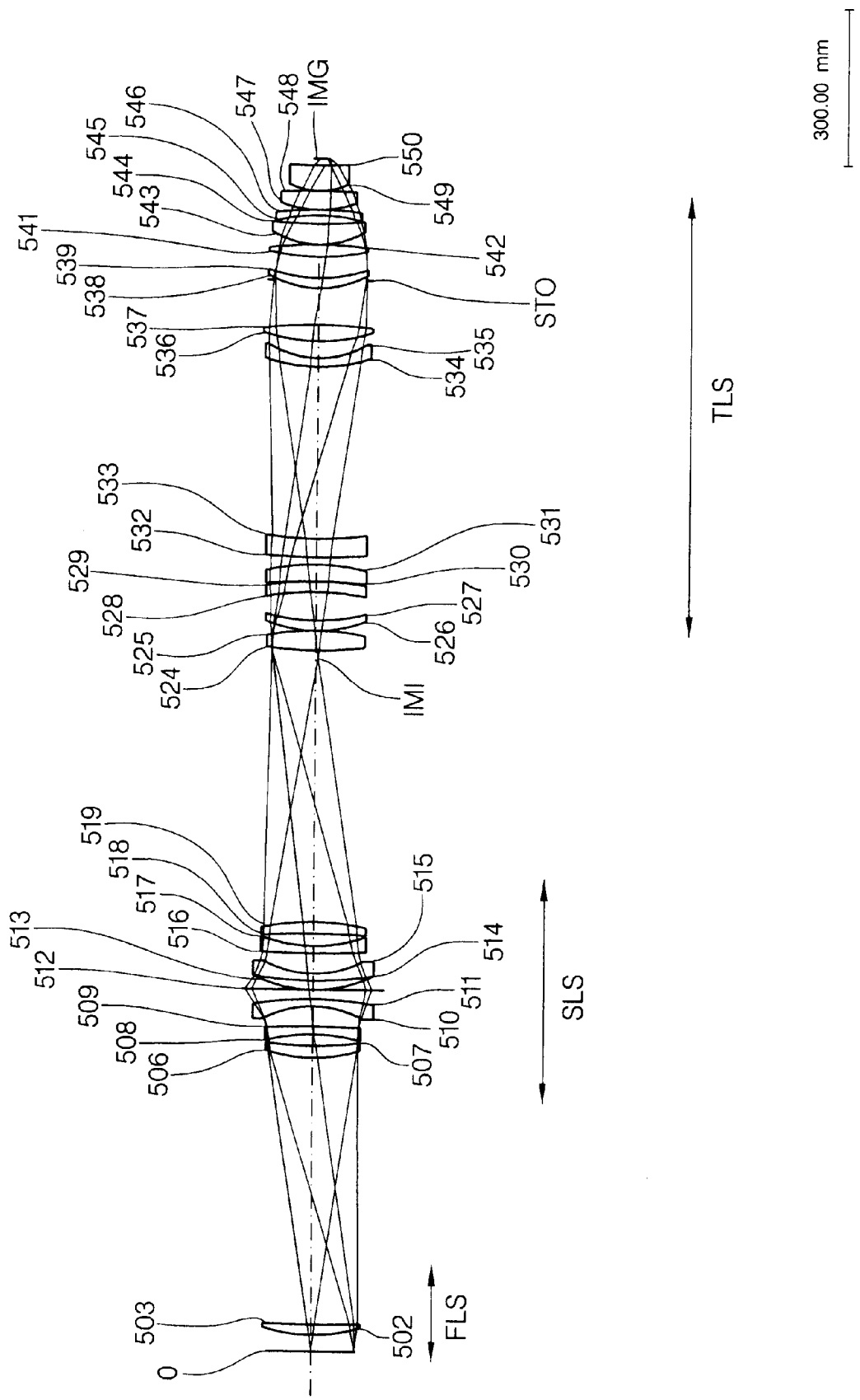
FIG. 6 is a section view of the lens arrangement of the sixth embodiment.

In the sixth embodiment of the invention shown in FIG. 6 the aspheric surfaces are situated in the third lens system on surface 533, 539 far away from the intermediate image IMI and in the second lens system SLS. In this embodiment the concave mirror 513 of the second lens system comprises an aspheric surface.

Details of the system are given in Table 6 in code-V-format in the annex. The number of the object in table 6 correspond to the reference number in FIG. 6.

Figure 7:
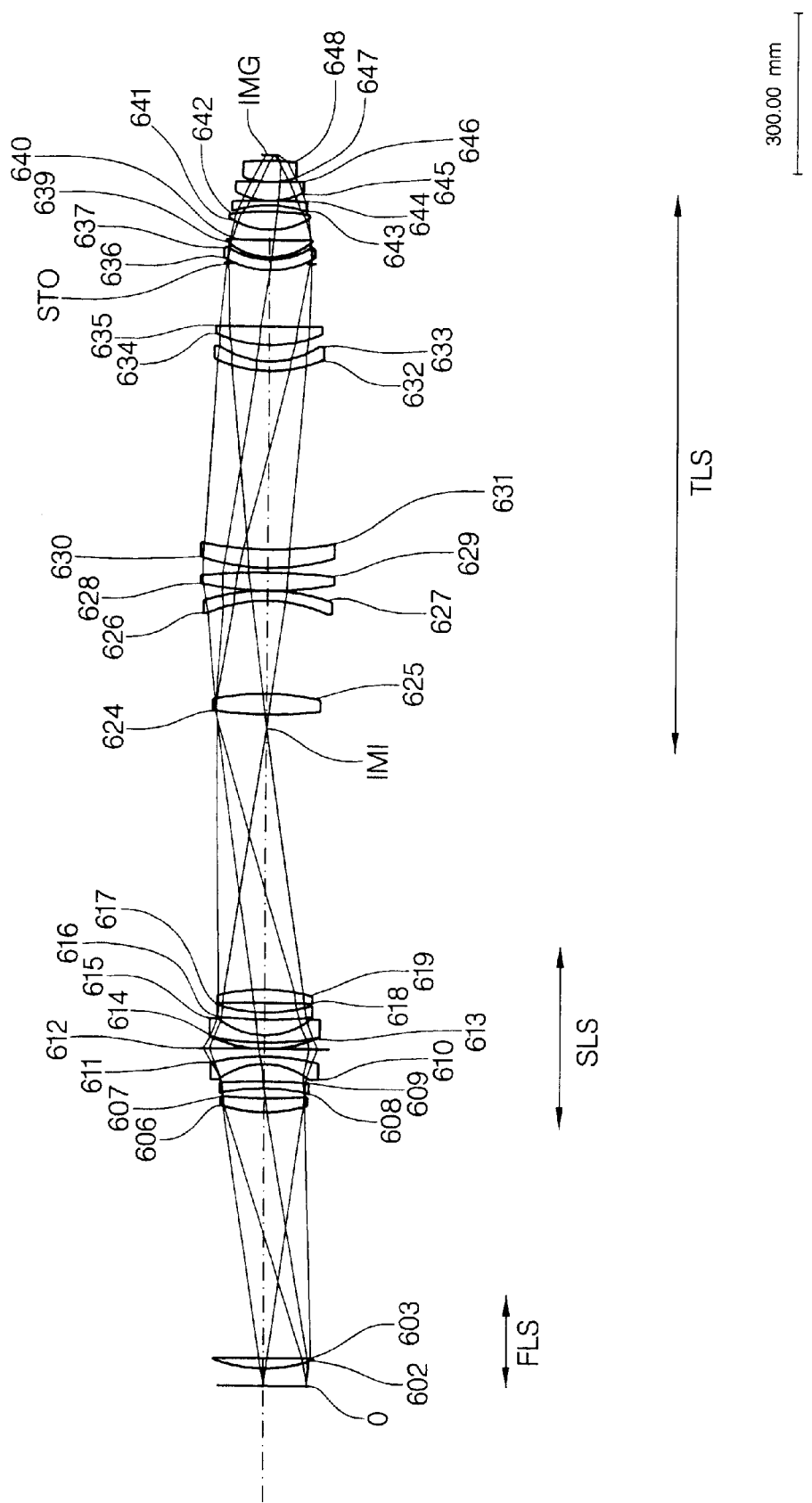
FIG. 7 is a section view of the lens arrangement of the seventh embodiment.

In the seventh embodiment of the invention shown in FIG. 7 the aspheric surfaces are situated in the third lens system TLS on surface 631, 637, 648 far away from the intermediate image IMI as in embodiment 6 and in the first lens system on surface 603. In contrast to embodiment 6 the aspheric surface of the first lens system is situated on a lens near the object 0 resp. reticle instead on the concave mirror.

Details are given in table 7 in code-V-format in the annex. The number of the object in table 7 corresponds to the reference number in FIG. 7.

WO 99/52004 cited in the inductory part of this application shows that with a generic catadioptric objective image side numerical apertures of up to 0.65 can be obtained with less than 16 lenses when entering at least 4 aspherical lenses.

The invention shows that increased resolution capabilities with numerical apertures of 0.7 to 0.85 and more, at unrestricted image fields and with state of the art correction, are obtained with lesser aspheres in the 0.7 NA range. With the number of 16 lenses and one aspherical surface per lens and on the concave mirror even 0.85 NA is demonstrated as compared to 0.65 NA with 8 aspherical surfaces of 10 lenses and one planar plate of example 4 of the cited WO 99/52004 application.

It is advantageous that between the object plane and the doubly passed group of lenses as a first lens system at least one lens is inserted, preferably exactly one. This could be a positive lens. It optimizes object side telecentricity. Aspherization of this lens, bending it to a meniscus, and aspherizing the concave surface are particularly preferred measures. Preferably, too, its object side surface has the smaller radius of curvature.

This lens of the first lens system FLS is also predestined to be used for implementation of correcting surfaces, which may be free-form aspheric surfaces, as it is easily accessible also after complete assembly of the lens.

It is also a very significant finding of the inventors, that this first lens system can be shifted off-axis, with its axis of symmetry arranged between the center of the object field and the optical axis. This allows for a rather symmetric illumination system as conventional with on-axis scanning systems. Generally, in this lens design effort is taken to keep the object side telecentricity very good. So even with the off-axis object field necessitated by the catadioptric design, the illumination system can be rotationally symmetric to the center of the object field, what allows for clearly reduced diameter of this system and consequently great cost reduction.

Figure 8:
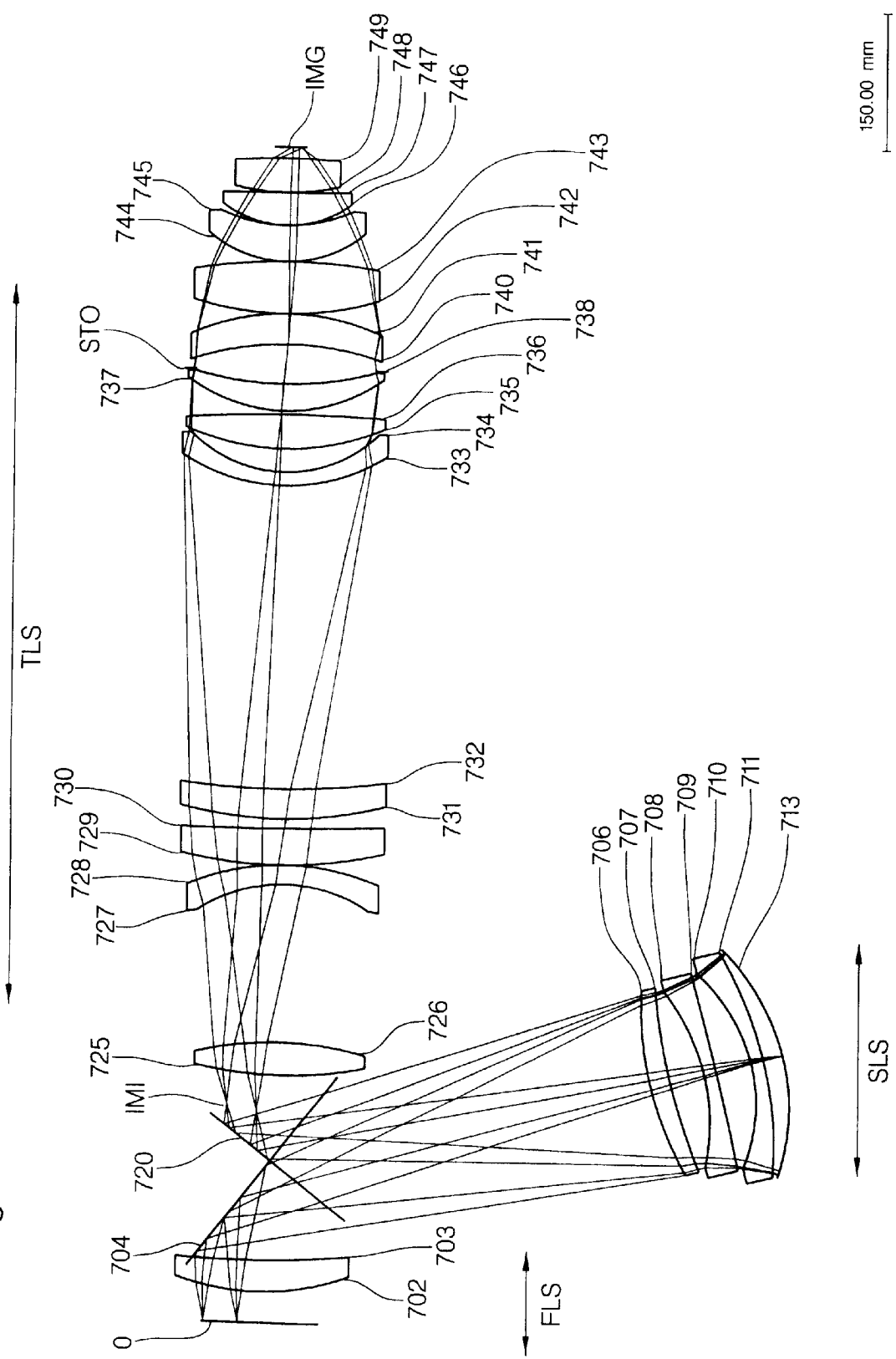
FIG. 8 is a section view of the lens arrangement of a eighth embodiment.
Figure 9:
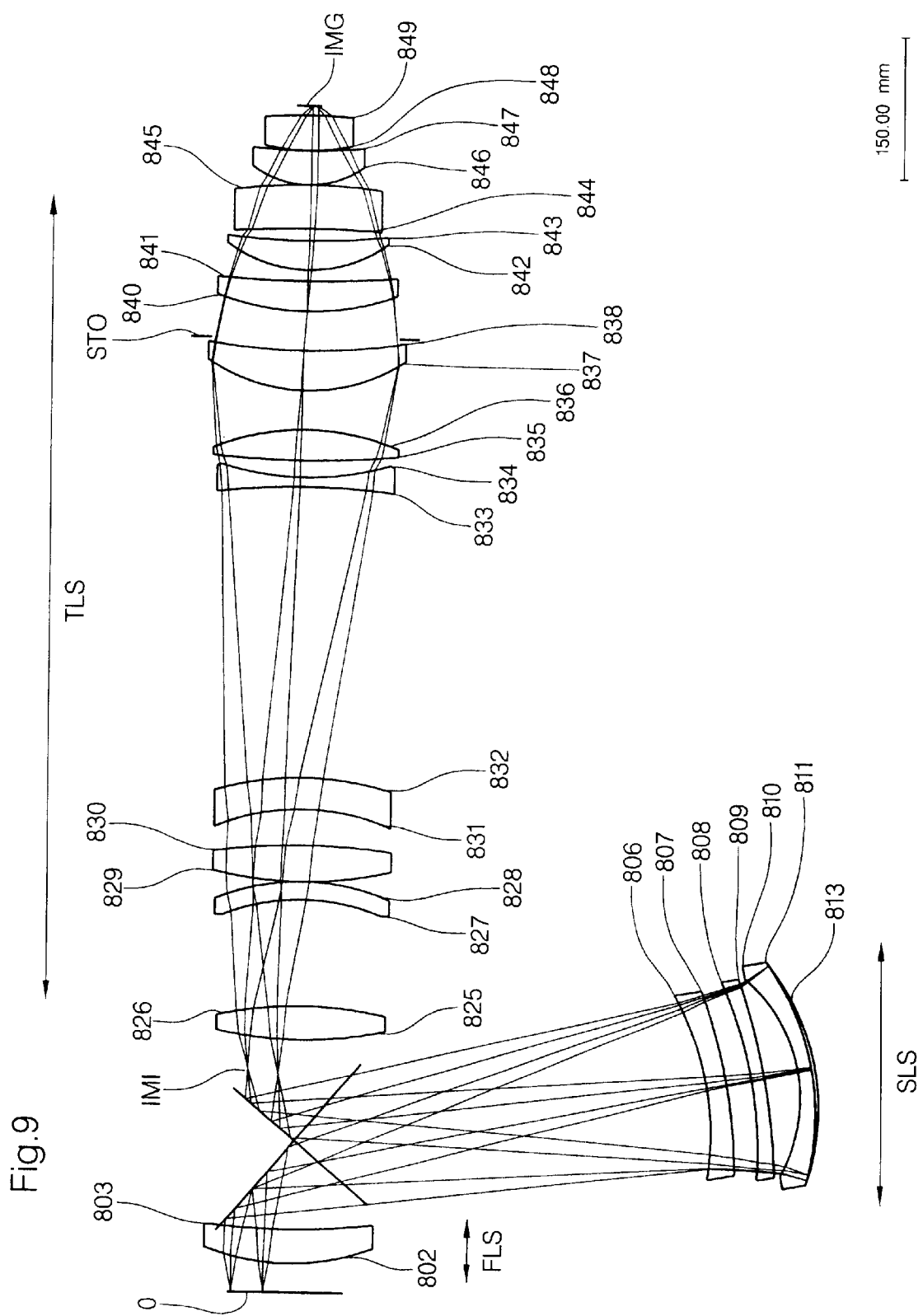
FIG. 9 is a section view of the lens arrangement of a ninth embodiment.

Also the optical axis in the region of this first lens system can be shifted with respect to the parallel optical axis of the refractive partial system, away from the concave mirror. This allows for a better division of the illuminated areas on the two folding mirrors arranged nearby in the preferred variations of the invention. This offset is 2.95 mm in the examples of FIGS. 5, 6 and 7 and is 17.5 mm in the NA=0.85 example of FIG. 8 and 12.5 mm in the NA=0.75 example of FIG. 9. The details of the embodiments of FIG. 8 and FIG. 9 are given in table 8 and table 9 in code-V-format in the annex. The number of the object in tables 8 and 9 correspond to the reference number in FIGS. 8 and 9.

Figure 10:
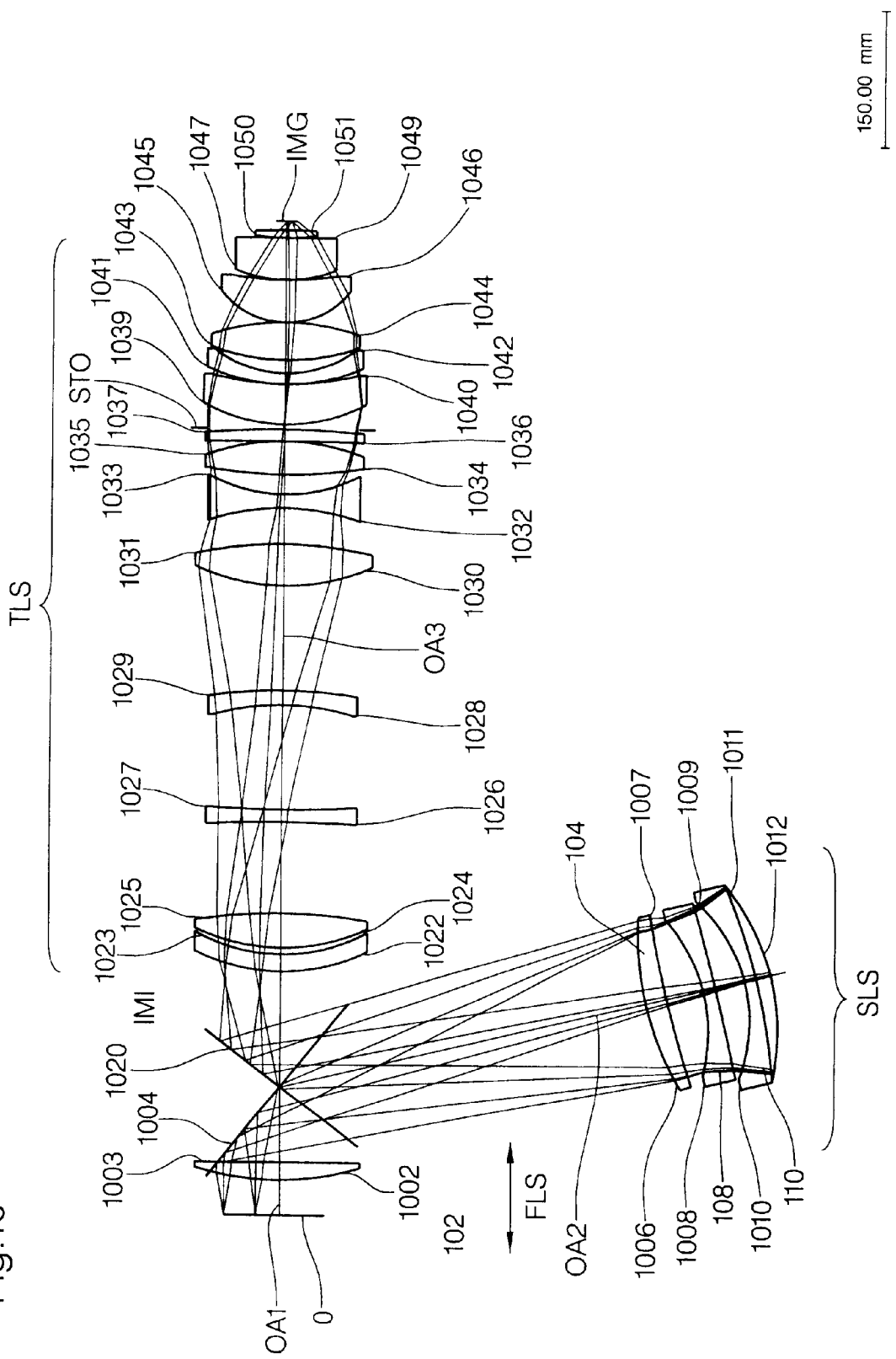
FIG. 10 is a section view of the lens arrangement of a tenth embodiment.

A tenth embodiment is shown in FIG. 10. The details of the tenth embodiment are given in table 10 in code-V-format in the annex. The number of the object in table 10 corresponds to the reference number in FIG. 10. The tenth embodiment is a 5× reduction system with a magnification ratio of −0.2. The image side aperture is NA=0.80. The projection lens comprises 17 lenses, one concave mirror 1012 and a planar protecting plate 1050/1051. All lenses are made of Calcium Fluoride (CaF$_2$). Eight lenses in the third lens system comprise an aspherical surface whereas all lenses in the second lens system and the concave mirror are spherical lenses. The rectangular field has the dimensions 22 mm to 7 mm in the image plane IMG, wherein the center of the field is arranged 4.62 mm off axis from the optical axis OA3 of the third lens system TLS. The projection lens is optimized for a wavelength of 157.63 nm+/−0.6 pm. The polychromatic wavefront aberration shows a maximum of 10 milliwaves at all field heights, the monochromatic wavefront aberration shows a maximum of 4 milliwaves. The folding angle between the optical axis OA2 of the double pass group with the lenses with surfaces 1006, 1007, 1008, 1009, 1010, 1011 and the axis OA1 of the first lens group is 104°. Therefore all light beams at the lenses of the double pass second lens system and the concave mirror 1012 are more distant from the object plane O than the first lens of the first lens group from the object plane is.

Figure 11:
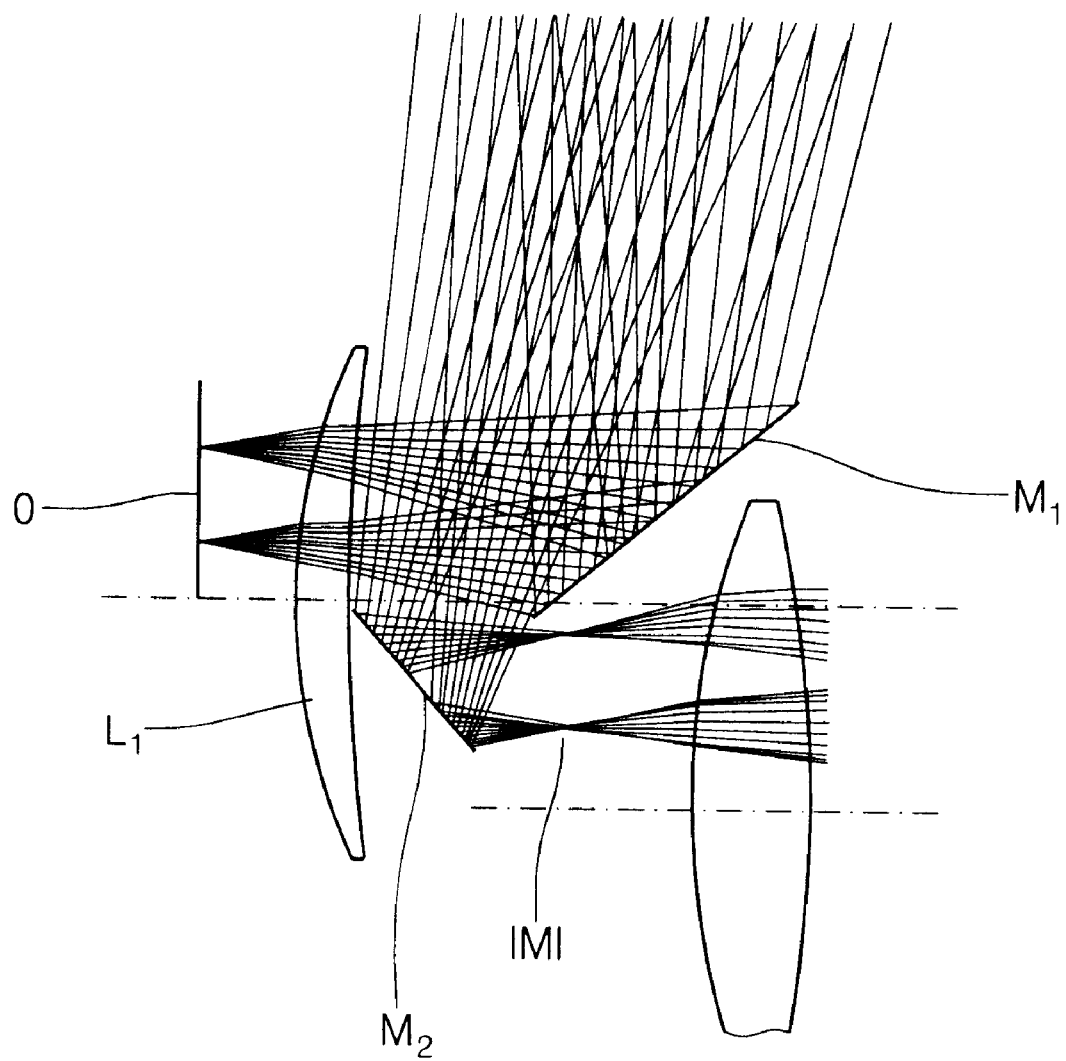
FIG. 11 is a view of an alternative arrangement of the folding mirrors.

FIG. 11 shows an alternative arrangement of the folding mirrors M1' and M2', where they do not share a common ridge. Here even stronger axis shift is needed. The construction length between object and image can be reduced in this way, and new compromise possibilities in passing by of the light beams at the folding mirrors are opened.

The folding mirrors of the other shown examples are conveniently established on a common prism substrate.

Alternatively, the folding mirrors can be internal surfaces of prisms passed by the light beam. The higher refractive index of prism material—i.e. calcium fluoride, other crystals, quartz glass or other optical glass—then allows for more compact transfer of high aperture beams.

Advantageously they are coated with reflection enhancing thin films, which can even more advantageously correct variations in phase shifts caused by reflections under different angles by adapted thicknesses.

Also, the folding mirrors can be formed with slight aspheric-non-rotationally symmetric, free-form surface forms for correction of these phase effects as well as other tiny errors of imaging of the system or of production tolerances.

The preferred configuration of the invention differs from the cited art in that the double pass lens second lens system and concave mirror are arranged along an unfolded optical axis, with two folding mirrors in the region, where the optical axis of this subsystem crosses with those of the first lens group and the refractive partial objective. The folding angle between the optical axis of the double pass second lens system and the other axes advantageously deviates from 90° such that at the lenses and the mirror all light beams are more distant from the object plane than the first lens surface of the first lens group is. Consequently, the necessary free access to the object plane needed for scanning does not interfere with the space needed for the mounts of the optical elements.

A further issue of the invention lies in the design of the double pass lens group having a minimal number of lenses. Each degree of freedom for correction of the imaging obtained by an additional lens here has twice the undesirable effects of absorption in the lens material and of reflection losses at the surfaces. Consequently only the lenses needed for putting into effect the concave mirror, for separating the light bundles at the folding mirrors and for keeping the length of the side arm established by the double pass group relatively short are provided.

In the examples shown the intermediate image IMI directly follows after the folding mirror arranged subsequent to the double path lens group. Though the space between this folding mirror and the intermediate image tends to be narrow, one or other lens can well be introduced here.

The lenses arranged after and near the intermediate image IMI are illuminated by light bundles situated strongly off axis, so that lens heating caused by light absorption leads to strongly asymmetric disturbing effects. Consequently, the number of lenses in this space is kept low, with normal forms and thicknesses to keep these lens heating influences low.

Aspherization of the lens next to the intermediate image is strongly suggested by EP 0 869 383. However, besides the above named asymmetry effect, there are further aspects making this less preferable. Once, the intermediate image is per its function in the objective badly corrected, so that the named separation of field specific image errors is disrupted.

Then, e.g. from E. Heynacher, Zeiss-Inform. 24, 19–25 (1978/79) Heft 88, it is long known that with complicated optical systems it is less appropriate to treat the imaging errors separately by aspheres, but to influence the correction of all imaging errors as a whole. Consequently it is preferred to distribute the aspheres onto lens surfaces of different relative influences to the relevant imaging errors.

Especially, the effect of aspherization of the first lens at the object side shows stronger influence onto distortion than a lens very near to the intermediate image can have.

EP 0 869 383 gives another condition for aspherical surfaces, namely 0.85<h/φ<1.2, which is of less relevance, as shown by the example of FIG. 9 and table 9. Here this parameter is for the aspheric surfaces 803=0.09, 811=1.22, 813=1.23, 834=0.84, 844=0.70, 849=0.14. Consequently, it is advantageous for the correction of high NA objectives of this sort, if one or more aspheric surfaces features this parameter h/φ>1.2.

Also here the novel concept of using aspherical surfaces situated oppositely, separated by a narrow air space, is introduced at the aspherical concave mirror 813 and the opposing surface 811 of the neighboring negative meniscus. This is contrary to the concept of one asphere per error to be corrected and allows for more precise influencing of the correction state of an objective—also in other optical concepts.

In the refractive partial objective a long drift space intermediate the intermediate image IMI and the aperture stop STO is typical, while the space between aperture stop STO and image plane IMG is densely packed with lenses. A meniscus concave versus the aperture stop STO, establishing a positive air lens with the neighboring lens is a typical correcting element introduced in previous applications of the inventors. This concave surface (844 in FIG. 9) is also a very effective location of an aspheric surface. Preferably this or other asphere in the space between aperture stop STO and image plane IMG is paired by an asphere (834 in FIG. 9) arranged approximately symmetrically on the other side of the aperture stop STO.

In the high numerical aperture applications of the invention also the most image-sideward lens is advantageously aspherized, namely on its image side, as surface 849 in FIG. 9 and as surface 749 in FIG. 8. Here the greatest incidence angles of the light rays occur and give special influence of the aspherics here.

Ongoing acceleration of the semiconductor roadmap forces the industry to extend optical lithography much further than ever expected. Including 157 nm wavelength radiation, today it is believed that optical lithography could even enable manufacturing at the 70 nm node of resolution under commercial conditions. The 50 nm node would require at least 157 nm optics with extremely high numerical apertures (>0.8). Extending wavelength further down to 126 nm ($Ar_2$-laser), would only help if optics (mirrors and a few transmittive, refractive lens elements, preferably LiF lens elements) can achieve numerical apertures well above 0.7. Translating the semiconductor roadmap into an exposure tool roadmap, not only new wavelengths are needed, but also extremely high NA optics will be introduced. To assure high enough process latitude, resolution enhancement methods will be implemented in volume manufacturing. Next to advanced mask technology, layer-tailored illumination schemes will be used.

As such illumination with linearly polarized light and with a quarter-wave plate at the aperture stop plane for image-side circularly polarized light is advantageous. An alternative can be radially polarized light as described in DE 195 35 392 A (U.S. Ser. No. 08/717,902) of the same assignee.

Such high numerical aperture objectives are provided by the invention, with FIG. 8 and table 8 giving the extreme image side numerical aperture NA=0.85 at 5× reduction, with a 22 mm×7 mm slit scanning image field, ±0.6 pm laser bandwidth at the 157.1 nm excimer laser line, with all lenses made from calcium fluoride crystal. Naturally, at this elevated demand for correction, the limit of 15 lenses given in WO 99/52004 with examples of moderate NA=0.65, is exceeded—but only by one additional lens, at 9 aspherical surfaces. Polychromatic wavefront aberration shows a maximum of 20 milliwaves at all field heights—a reasonably good imaging quality at these conditions.

The embodiment of FIG. 9 and table 9 features at 5× reduction imaging with a 22 mm×7 mm image field at 157.1 nm ±0.6 pm with the high image side NA=0.75. The 16 lenses and 1 concave mirror obtain this at a wavefront error of maximal rms of 21 milliwaves with only 5 aspherical surfaces as described above.

If preferred for reasons of gas purging at the reticle or wafer, the object side as well as the image side of such objectives can be a planar surface, either by introducing a planar protecting plate as is in widespread use, e.g. in WO 99/52004, or by changing design under the restriction of a planar face.

The invention covers all the combinations and subcombinations of the features give in this specification and the claims, drawings and tables.

While examples are given for the scanning scheme of exposure, the invention as well is useful with step-and-repeat or stitching. Stitching allows for specifically smaller optics.

TABLE 1 wavelength = 193.31 nm

| Object | Radius | Thickness RMD | Glass sort |
|---|---|---|---|
| >OBJ: | INFINITY | 0.000000 | |
| 1: | INFINITY | 35.000000 | |
| 2: | 534.41573 | 16.000000 | 'SIO2HL' |
| 3: | −2605.52657 | 82.000000 | |
| 4: | INFINITY | 423.377560 | |
| 5: | INFINITY | 0.000000 | |
| 6: | 524.08780 | 50.000000 | 'SIO2HL' |
| 7: | 903.64667 | 44.861212 | |
| 8: | −263.10576 | 15.000000 | 'SIO2HL' |
| 9: | −1376.18978 | 33.775444 | |
| ASP: | | | |
| K: 0.000000 | | | |
| IC: YES | CUF: 0.000000 | | |
| A: 0.983295E−10 B: 0.156925E−14 C: 0.660351E−20 | | | |
| D:0.000000E+00 | | | |
| 10: | −209.43665 | 15.000000 | 'SIO2HL' |
| 11: | −400.74819 | 12.442047 | |
| 12: | INFINITY | 0.000010 | REFL |
| 13: | 278.05481 | 12.442047 | REFL |
| 14: | 400.74819 | 15.000000 | 'SIO2HL' |
| 15: | 209.43665 | 33.775444 | |
| 16: | 1376.18978 | 15.000000 | 'SIO2HL' |
| ASP: | | | |
| K: 0.000000 | | | |
| IC: YES | CUF: 0.000000 | | |
| A: −.983295E−10 B: −.156925E−14 C: −.660351E−20 | | | |
| D: 0.000000E+00 | | | |
| 17: | 263.10576 | 44.861212 | |
| 18: | −903.64667 | 50.000000 | 'SIO2HL' |
| 19: | −524.08780 | 449.719482 | |
| 20: | INFINITY | 0.000000 | |
| 21: | INFINITY | 63.778860 | |
| 22: | 367.04203 | 39.381898 | 'SIO2HL' |
| 23: | −813.93537 | 12.355245 | |
| 24: | 862.20789 | 26.902539 | 'SIO2HL' |
| 25: | −2189.11598 | 19.271290 | |
| 26: | −280.32916 | 23.514083 | 'SIO2HL' |
| 27: | 551.01352 | 7.025237 | |
| 28: | 1073.23821 | 46.193223 | 'SIO2HL' |
| 29: | −393.66672 | 1.000000 | |
| 30: | 942.86330 | 31.837703 | 'SIO2HL' |
| 31: | −734.28385 | 17.595477 | |
| 32: | 471.84849 | 34.925052 | 'SIO2HL' |
| 33: | 223.32640 | 54.276947 | |

TABLE 1-continued wavelength = 193.31 nm

| Object | Radius | Thickness RMD | Glass sort |
|---|---|---|---|
| 34: | −238.14826 | 16.480387 | 'SIO2HL' |
| 35: | −432.42551 | 1.000000 | |
| 36: | 846.35305 | 38.186692 | 'SIO2HL' |
| 37: | −382.59164 | 135.289717 | |
| 38: | 431.86893 | 43.207971 | 'SIO2HL' |
| 39: | 14250.66524 | 1.000000 | |
| 40: | 290.44991 | 15.459700 | 'SIO2HL' |
| 41: | 183.43506 | 56.245505 | |
| 42: | −238.71906 | 28.322086 | 'SIO2HL' |
| 43: | −689.33370 | 114.792439 | |
| 44: | −429.48801 | 28.350285 | 'SIO2HL' |
| 45: | −258.98856 | 1.000000 | |
| 46: | 398.85931 | 39.841410 | 'SIO2HL' |
| 47: | 230.04262 | 11.000000 | |
| 48: | 324.81640 | 49.875208 | 'SIO2HL' |
| 49: | −854.01841 | 1.000000 | |
| 50: | 221.87147 | 18.942210 | 'SIO2HL' |
| 51: | 167.65528 | 16.891234 | |
| 52: | 253.72485 | 28.225022 | 'SIO2HL' |
| 53: | 7134.26986 | 0.790361 | |
| STO: | INFINITY | 5.370968 | |
| 55: | 156.41574 | 37.458696 | 'SIO2HL' |
| 56: | 425.02539 | 13.790057 | |
| 57: | 2532.66232 | 21.354413 | 'SIO2HL' |
| 58: | −487.11572 | 0.100000 | |
| 59: | −754.17801 | 35.849436 | 'SIO2HL' |
| 60: | 117.83998 | 10.996190 | |
| 61: | 174.62750 | 35.656142 | 'SIO2HL' |
| 62: | −1054.34644 | 0.100000 | |
| 63: | 110.05260 | 64.820400 | 'CAF2HL' |
| 64: | 4815.31686 | 0.100000 | |
| 65: | 241.11586 | 26.846900 | 'CAF2HL' |
| 66: | −465.81838 | 14.164338 | |
| IMG: | INFINITY | −0.000247 | |

TABLE 2 wavelength = 193.31 nm

| Object | Radius | Thickness RMD | Glass sort |
|---|---|---|---|
| >OBJ: | INFINITY | 0.000000 | |
| 101: | INFINITY | 35.000000 | |
| 102: | 443.12451 | 16.000000 | 'SIO2HL' |
| 103: | −18962.23411 | 82.000000 | |
| 104: | INFINITY | 408.713716 | |
| 105: | INFINITY | 0.000000 | |
| 106: | 513.10831 | 35.000000 | 'SIO2HL' |
| 107: | −789.19840 | 7.958704 | |
| 108: | −431.08447 | 15.000000 | 'SIO2HL' |
| 109: | 2470.39244 | 39.539157 | |
| 110: | −305.22015 | 15.000000 | 'SIO2HL' |
| 111: | −2422.57208 | 38.046226 | |
| 112: | −202.24219 | 15.000000 | 'SIO2HL' |
| 113: | −372.89974 | 12.390873 | |
| 114: | INFINITY | 0.000010 | REFL |
| 115: | 277.58610 | 12.390873 | REFL |
| 116: | 372.89974 | 15.000000 | 'SIO2HL' |
| 117: | 202.24219 | 38.046226 | |
| 118: | 2422.57208 | 15.000000 | 'SIO2HL' |
| 119: | 305.22015 | 39.539157 | |
| 120: | −2470.39244 | 15.000000 | 'SIO2HL' |
| 121: | 431.08447 | 7.958704 | |
| 122: | 789.19840 | 35.000000 | 'SIO2HL' |
| 123: | −513.10831 | 444.481741 | |
| 124: | INFINITY | 0.000000 | |
| 125: | INFINITY | 63.778860 | |
| 126: | 390.52726 | 31.324696 | 'SIO2HL' |
| 127: | −683.31437 | 6.752019 | |
| 128: | 1069.12804 | 24.466364 | 'SIO2HL' |
| 129: | −1717.09522 | 19.648878 | |
| 130: | −271.40065 | 24.662421 | |

TABLE 2-continued wavelength = 193.31 nm

| Object | Radius | Thickness RMD | Glass sort |
|---|---|---|---|
| 131: | 585.28487 | 4.258045 | |
| 132: | 1037.54513 | 47.522078 | 'SIO2HL' |
| 133: | −299.20504 | 1.000000 | |
| 134: | 1517.35976 | 14.493847 | 'SIO2HL' |
| 135: | −1667.38733 | 29.793625 | |
| 136: | 374.98529 | 38.496191 | 'SIO2HL' |
| 137: | 215.15028 | 58.056542 | |
| 138: | −244.39173 | 20.364718 | 'SIO2HL' |
| 139: | −481.59968 | 1.000000 | |
| 140: | 685.96658 | 50.000000 | 'SIO2HL' |
| 141: | −466.91597 | 124.805511 | |
| 142: | 337.88037 | 26.730825 | 'SIO2HL' |
| 143: | 60685.02516 | 1.000000 | |
| 144: | 307.00084 | 25.717686 | 'SIO2HL' |
| 145: | 173.62675 | 54.501370 | |
| 146: | −283.94563 | 28.052025 | 'SIO2HL' |
| 147: | −1327.60130 | 127.853517 | |
| 148: | −457.68711 | 32.289214 | 'SIO2HL' |
| 149: | −280.72637 | 1.000000 | |
| 150: | 350.95083 | 33.551443 | 'SIO2HL' |
| 151: | 233.87449 | 11.000000 | |
| 152: | 316.35603 | 44.382117 | 'SIO2HL' |
| 153: | −1117.42550 | 1.000000 | |
| 154: | 218.72076 | 22.816384 | 'SIO2HL' |
| 155: | 170.60059 | 13.066780 | |
| 156: | 248.49595 | 27.215517 | 'SIO2HL' |
| 157: | 2867.70932 | −0.636677 | |
| STO: | INFINITY | 5.190673 | |
| 159: | 159.10817 | 37.337945 | 'SIO2HL' |
| 160: | 450.28461 | 13.813926 | |

ASP:
K: 0.000000
IC: YES    CUF: 0.000000
A: 0.284543E−09  B: −.121419E−12  C: −.294548E−17
D:−.112803E−21  E: 0.107208E−26  F: 0.606134E−30
G: 0.000000E+00  H: 0.000000E+00  J: 0.000000E+00

| Object | Radius | Thickness RMD | Glass sort |
|---|---|---|---|
| 161: | 4993.99819 | 56.358019 | 'SIO2HL' |
| 162: | 125.35419 | 8.227596 | |
| 163: | 178.76516 | 35.546249 | 'SIO2HL' |
| 164: | −544.56516 | 0.100000 | |
| 165: | 111.13737 | 65.000000 | 'CAF2HL' |
| 166: | 633.24492 | 0.100000 | |
| 167: | 218.73155 | 30.206802 | 'CAF2HL' |
| 168: | −335.35055 | 12.082469 | |
| IMG: | INFINITY | −0.000503 | |

TABLE 3 wavelength = 193.31 nm

| Object | Radius | Thickness RMD | Glass sort |
|---|---|---|---|
| >OBJ: | INFINITY | 0.000000 | |
| 201: | INFINITY | 35.000000 | |
| 202: | 412.00283 | 21.000000 | 'SIO2HL' |
| 203: | 13807.40229 | 82.000000 | |
| 204: | INFINITY | 473.169978 | |
| 205: | INFINITY | 0.000000 | |
| 206: | −253.51555 | 16.000000 | 'SIO2HL' |
| 207: | −544.16517 | 27.805541 | |
| 208: | −205.78974 | 16.000000 | 'SIO2HL' |
| 209: | −424.01744 | 13.131367 | |
| 210: | INFINITY | 0.000010 | REFL |
| 211: | 282.11038 | 13.131367 | REFL |

ASP:
K: 0.000000
IC: YES    CUF: 0.000000
A: 0.102286E−09  B: 0.163583E−14  C: 0.222395E−19
D: −.127469E−23  E: 0.130171E−27  F: −.388631E−32
G: 0.000000E+00  H: 0.000000E+00  J: 0.000000E+00

| | | | |
|---|---|---|---|
| 212: | 424.01744 | 16.000000 | 'SIO2HL' |
| 213: | 205.78974 | 27.805541 | |

TABLE 3-continued wavelength = 193.31 nm

| Object | Radius | Thickness RMD | Glass sort |
|---|---|---|---|
| 214: | 544.16517 | 16.000000 | 'SIO2HL' |
| 215: | 253.51555 | 530.616842 | |
| 216: | INFINITY | 0.000000 | |
| 217: | INFINITY | 63.778860 | |
| 218: | 636.23394 | 27.336162 | 'SIO2HL' |
| 219: | −774.44237 | 0.100000 | |
| 220: | 638.45165 | 27.867198 | 'SIO2HL' |
| 221: | −950.10950 | 26.668510 | |
| 222: | −332.85587 | 38.386102 | 'SIO2HL' |
| 223: | 866.08021 | 18.442845 | |
| 224: | −1525.57443 | 47.039609 | 'SIO2HL' |
| 225: | −390.53318 | 1.000000 | |
| 226: | 1733.78965 | 28.403565 | 'SIO2HL' |
| 227: | −524.35781 | 0.100000 | |
| 228: | 835.74339 | 16.000000 | 'SIO2HL' |
| 229: | 298.64601 | 57.500000 | |
| 230: | −259.59279 | 16.000000 | 'SIO2HL' |
| 231: | −411.70682 | 1.000000 | |
| 232: | 1128.90538 | 36.253267 | 'SIO2HL' |
| 233: | −477.96774 | 253.556594 | |
| 234: | 435.03169 | 32.866003 | 'SIO2HL' |
| 235: | −2559.42430 | 1.000000 | |
| 236: | 275.15076 | 16.000000 | 'SIO2HL' |
| 237: | 187.82645 | 66.000000 | |
| 238: | −296.62496 | 44.201058 | 'SIO2HL' |
| 239: | −690.62720 | 135.986515 | |
| 240: | 4019.70777 | 21.709054 | 'SIO2HL' |
| 241: | −800.90710 | 1.000000 | |
| 242: | 853.98857 | 50.000000 | 'S1O2HL' |
| 243: | 254.20904 | 12.399910 | |
| 244: | 408.20829 | 38.016254 | 'SIO2HL' |
| 245: | −643.03332 | 1.000000 | |
| 246: | 228.71372 | 16.000000 | 'SIO2HL' |
| 247: | 175.28033 | 14.986197 | |
| 248: | 269.82502 | 31.500000 | 'SIO2HL' |
| 249: | 20733.22818 | −7.061102 | |
| STO: | INFINITY | 8.061102 | |
| 251: | 160.50399 | 37.926522 | 'SIO2HL' |
| 252: | 457.13661 | 12.706908 | |
| 253: | 1597.64988 | 23.273549 | 'SIO2HL' |
| 254: | −728.49646 | 0.100000 | |
| 255: | −2709.38689 | 37.761809 | 'SIO2HL' |
| 256: | 120.00817 | 10.277526 | |
| 257: | 171.38842 | 38.220630 | 'SIO2HL' |
| 258: | −2029.55473 | 0.100000 | |
| 259: | 116.83775 | 64.846281 | 'CAF2HL' |
| 260: | 1815.17026 | 0.100000 | |
| 261: | 212.15910 | 28.928425 | 'CAF2HL' |
| 262: | −501.97805 | 15.000534 | |
| IMG: | INFINITY | −0.000523 | |

TABLE 4 wavelength = 193.31 nm

| Object | Radius | Thickness RMD | Glass sort |
|---|---|---|---|
| >OBJ: | INFINITY | 0.000000 | |
| 301: | INFINITY | 35.000000 | |
| 302: | 434.57513 | 22.000000 | 'SIO2HL' |
| 303: | 36267.41000 | 82.000000 | |
| 304: | INFINITY | 477.044163 | |
| 305: | INFINITY | 0.000000 | |
| 306: | −254.30195 | 16.000000 | 'SIO2HL' |
| 307: | −532.25303 | 29.144125 | |
| 308: | −204.79768 | 16.000000 | 'SIO2HL' |
| 309: | −421.29373 | 13.323325 | |
| 310: | INFINITY | 0.000010 | REFL |
| 311: | 285.25831 | 13.323325 | REFL |

ASP:
K: 0.000000
IC: YES   CUF: 0.000000

TABLE 4-continued wavelength = 193.31 nm

| Object | Radius | Thickness RMD | Glass sort |
|---|---|---|---|

A: 0.116419E−09  B: 0.112957E−14  C: −.937828E−20
D: −.466752E−24  E: 0.506427E−28  F: −.185566E−32
G: 0.000000E+00  H: 0.000000E+00  J: 0.000000E+00

| 312: | 421.29373 | 16.000000 | 'SIO2HL' |
|---|---|---|---|
| 313: | 204.79768 | 29.144125 | |
| 314: | 532.25303 | 16.000000 | 'SIO2HL' |
| 315: | 254.30195 | 537.666508 | |
| 316: | INFINITY | 0.000000 | |
| 317: | INFINITY | 63.778860 | |
| 318: | 801.47063 | 30.675310 | 'SIO2HL' |
| 319: | −741.91592 | 0.100000 | |
| 320: | 852.20028 | 21.124661 | 'SIO2HL' |
| 321: | −1040.41670 | 31.707289 | |
| 322: | −270.54645 | 26.187590 | 'SIO2HL' |
| 323: | 600.48250 | 18.319696 | |
| 324: | 774.95053 | 41.436216 | 'SIO2HL' |
| 325: | −355.71105 | 1.000000 | |
| 326: | 1591.83158 | 29.490290 | 'SIO2HL' |
| 327: | −556.23481 | 53.458289 | |
| 328: | 854.87463 | 16.000000 | 'SIO2HL' |
| 329: | 282.30181 | 54.422763 | |
| 330: | −261.43332 | 24.488537 | 'SIO2HL' |
| 331: | −411.65692 | 1.000000 | |
| 332: | 1107.48205 | 37.032421 | 'SIO2HL' |
| 333: | −513.59706 | 246.562860 | |
| 334: | 423.57328 | 28.982815 | 'SIO2HL' |
| 335: | 76613.31446 | 1.000000 | |
| 336: | 237.50869 | 16.000000 | 'SIO2HL' |
| 337: | 171.60021 | 63.162192 | |
| 338: | −285.36403 | 50.000000 | 'SIO2HL' |
| 339: | −902.91449 | 95.050310 | |
| 340: | −733.54713 | 21.388284 | 'SIO2HL' |
| 341: | −375.20521 | 1.000000 | |
| 342: | 436.34842 | 50.000000 | 'SIO2HL' |
| 343: | 264.04939 | 12.000000 | |
| 344: | 395.02148 | 37.208539 | 'S1O2HL' |
| 345: | −792.61152 | 1.000000 | |
| 346: | 215.61815 | 20.499145 | 'SIO2HL' |
| 347: | 165.98868 | 14.685149 | |
| 348: | 248.36356 | 31.000000 | 'SIO2HL' |
| 349: | 3136.09812 | −8.174425 | |
| STO: | INFINITY | 9.174425 | |
| 351: | 149.01853 | 41.331450 | 'S1O2HL' |
| 352: | 363.61783 | 14.435195 | |

ASP:
K: 0.000000
IC: YES   CUF: 0.000000
A: 0.106229E−08  B: −.233769E−12  C: −.128409E−17
D: −.720355E−21  E: 0.577631E−25  F: −.147820E−29
G: 0.000000E+00  H: 0.000000E+00  J: 0.000000E+00

| 353: | 881.72413 | 29.308297 | 'SIO2HL' |
|---|---|---|---|
| 354: | 121.03439 | 14.172084 | |
| 355: | 207.65180 | 41.413236 | 'SIO2HL' |
| 356: | −639.91052 | 0.100000 | |
| 357: | 123.89834 | 65.000000 | 'CAF2HL' |
| 358: | 609.59778 | 0.100000 | |
| 359: | 186.60911 | 35.732940 | 'CAF2HL' |
| 360: | −313.58998 | 15.000087 | |
| IMG: | INFINITY | −0.000089 | |

CODE V > in wav
CODE V > wav

TABLE 5 wavelength = 157.13 nm

| Object | Radius | Thickness RMD | Glass sort |
|---|---|---|---|
| >OBJ: | INFINITY | 0.000000 | |
| 401: | INFINITY | 34.000000 | |
| 402: | 326.89134 | 18.000000 | 'CAF2HL' |
| 403: | 7134.75200 | 91.000000 | |

TABLE 5-continued wavelength = 157.13 nm

| Object | Radius | Thickness | RMD | Glass sort |
|---|---|---|---|---|
| 404: | INFINITY | 438.917225 | | |
| 405: | INFINITY | 0.000000 | | |
| 406: | 386.39605 | 22.000000 | | 'CAF2HL' |
| 407: | 3173.10800 | 23.000000 | | |
| 408: | −263.73446 | 13.000000 | | 'CAF2HL' |
| 409: | 1274.99700 | 36.757293 | | |
| 410: | −173.05552 | 14.000000 | | 'CAF2HL' |
| 411: | −398.57456 | 12.325630 | | |
| 412: | INFINITY | 0.000010 | REFL | |
| 413: | 246.26462 | 12.325630 | REFL | |
| 414: | 398.57456 | 14.000000 | | 'CAF2HL' |
| 415: | 173.05552 | 36.757293 | | |
| 416: | −1274.99700 | 13.000000 | | 'CAF2HL' |
| 417: | 263.73446 | 23.000000 | | |
| 418: | −3173.10800 | 22.000000 | | 'CAF2HL' |
| 419: | −386.39605 | 0.000000 | | |
| 420: | INFINITY | 435.917225 | | |
| 421: | INFINITY | 78.197752 | | |
| 422: | INFINITY | 60.000000 | | |
| 423: | INFINITY | −0.037541 | | |
| 424: | 305.29233 | 35.000000 | | 'CAF2HL' |

ASP:
K: 0.000000
IC: YES    CUF: 0.000000
A: −.983943E−08    B: 0.197982E−13    C: 0.331141E−17
D: −.546921E−21    E: 0.476298E−25    F: −.165982E−29
G: 0.000000E+00    H: 0.000000E+00    J: 0.000000E+00

| | | | | |
|---|---|---|---|---|
| 425: | −609.90977 | 175.000000 | | |
| 426: | −211.27437 | 20.000000 | | 'CAF2HL' |
| 427: | −296.93430 | 1.000000 | | |
| 428: | 918.04784 | 32.000000 | | 'CAF2HL' |
| 429: | −450.01625 | 10.220682 | | |
| 430: | 211.00994 | 35.000041 | | 'CAF2HL' |
| 431: | 147.86638 | 291.880529 | | |

ASP:
K: 0.000000
IC: YES    CUF: 0.000000
A: 0.102239E−07    B: 0.375361E−12    C: 0.202452E−16
D: −.158059E−22    E: 0.105932E−24    F: −.746588E−30
G: 0.000000E+00    H: 0.000000E+00    J: 0.000000E+00

| | | | | |
|---|---|---|---|---|
| 432: | 302.52916 | 14.999813 | | 'CAF2HL' |
| 433: | 182.15262 | 32.488787 | | |
| 434: | 325.54311 | 32.000000 | | 'CAF2HL' |
| 435: | −472.69366 | 3.402424 | | |
| 436: | 132.72874 | 19.621815 | | 'CAF2HL' |
| 437: | 197.27963 | 19.825000 | | |

ASP:
K: 0.000000
IC: YES    CUF: 0.000000
A: 0.132547E−07    B: 0.196227E−12    C: 0.495156E−17
D: 0.179425E−21    E: 0.681679E−25    F: 0.439118E−29
G: 0.000000E+00    H: 0.000000E+00    J: 0.000000E+00

| | | | | |
|---|---|---|---|---|
| STO: | INFINITY | 30.976200 | | |
| 439: | 1247.88900 | 21.000000 | | 'CAF2HL' |
| 440: | −441.06952 | 1.000000 | | |
| 441: | 106.43847 | 30.279452 | | 'CAF2HL' |
| 442: | 390.31325 | 17.376730 | | |
| 443: | −262.38753 | 10.000000 | | 'CAF2HL' |
| 444: | 8245.04000 | 1.000000 | | |
| 445: | 105.22412 | 35.374148 | | 'CAF2HL' |
| 446: | 380.86930 | 1.000000 | | |
| 447: | 131.60165 | 36.324916 | | 'CAF2HL' |
| 448: | −9747.89700 | 12.069889 | | |

ASP:
K: 0.000000
IC: YES    CUF: 0.000000
A: 0.179402E−06    B: −.398734E−10    C: −.217607E−13
D: 0.684630E−16    E: −.703555E−19    F: 0.266200E−22
G: 0.000000E+00    H: 0.000000E+00    J: 0.000000E+00

| | | | | |
|---|---|---|---|---|
| IMG: | INFINITY | −0.000356 | | |

TABLE 6 wavelength = 157.13 nm

| Object | Radius | Thickness | RMD | Glass sort |
|---|---|---|---|---|
| >OBJ: | INFINITY | 0.000000 | | |
| 501: | INFINITY | 34.000000 | | |
| 502: | 340.25194 | 18.000000 | | 'CAF2HL' |
| 503: | −23456.66512 | 91.000000 | | |
| 504: | INFINITY | 427.039664 | | |
| 505: | INFINITY | 0.000000 | | |
| 506: | 339.11803 | 22.000000 | | 'CAF2HL' |
| 507: | 677.92271 | 23.000000 | | |
| 508: | −270.98695 | 13.000000 | | 'CAF2HL' |
| 509: | −16554.24766 | 44.216394 | | |
| 510: | −179.26036 | 14.000000 | | 'CAF2HL' |
| 511: | −499.04921 | 16.743922 | | |
| 512: | INFINITY | 0.000010 | REFL | |
| 513: | 244.48659 | 16.743922 | REFL | |

ASP:
K: 0.000000
IC: YES    CUF: 0.000000
A: −.837113E−10    B: −.251110E−13    C: −.130822E−17    D: −.680466E−22
E: −.129779E−26    F: −.646050E−31    G: 0.000000E+00    H: 0.000000E+00
J: 0.000000E+00

| | | | | |
|---|---|---|---|---|
| 514: | 499.04921 | 14.000000 | | 'CAF2HL' |
| 515: | 179.26036 | 44.216394 | | |
| 516: | 16554.24766 | 13.000000 | | 'CAF2HL' |
| 517: | 270.98695 | 23.000000 | | |
| 518: | −677.92271 | 22.000000 | | 'CAF2HL' |
| 519: | −339.11803 | 0.000000 | | |
| 520: | INFINITY | 424.039664 | | |

TABLE 6-continued wavelength = 157.13 nm

| Object | Radius | Thickness | RMD | Glass sort | | |
|---|---|---|---|---|---|---|
| 521: | INFINITY | 48.414185 | | | | |
| 522: | INFINITY | 60.000000 | | | | |
| 523: | INFINITY | 0.000000 | | | | |
| 524: | 709.73646 | 35.000000 | | 'CAF2HL' | | |
| 525: | −405.70150 | 1.000000 | | | | |
| 526: | 232.80755 | 20.000000 | | 'CAF2HL' | | |
| 527: | 383.54136 | 54.440692 | | | | |
| 528: | −399.49382 | 20.000000 | | 'CAF2HL' | | |
| 529: | −455.76820 | 1.000000 | | | | |
| 530: | −581.98648 | 32.000000 | | 'CAF2HL' | | |
| 531: | −449.85046 | 13.936275 | | | | |
| 532: | 834.67326 | 35.000041 | | 'CAF2HL' | | |
| 533: | 504.57916 | 338.825443 | | | | |

ASP:
K: 0.000000
IC: YES    CUF: 0.000000
A: 0.201937E−07    B: 0.255796E−12    C: −.123108E−17    D: 0.115629E−20
E: −.110440E−24    F: 0.456621E−29    G: 0.000000E+00    H: 0.000000E+00
J: 0.000000E+00

| | | | | | | |
|---|---|---|---|---|---|---|
| 534: | 295.96006 | 14.999813 | | 'CAF2HL' | | |
| 535: | 178.17958 | 32.488787 | | | | |
| 536: | 304.23731 | 32.000000 | | 'CAF2HL' | | |
| 537: | −637.25902 | 81.513603 | | | 100 | 100 |
| STO: | INFINITY | −10.161100 | | | 100 | 100 |
| 538: | 160.25766 | 19.621815 | | 'CAF2HL' | 100 | 100 |
| 539: | 250.37700 | 43.823508 | | | 100 | 100 |

ASP:
K: 0.000000    KC: 100
IC: YES    CUF: 0.000000    CCF: 100
A: 0.192340E−07    B: −.348224E−12    C: −.223569E−16    D: −.380011E−21
AC: 100    BC: 100    CC: 100    DC: 100
E: 0.523462E−25    F: 0.264881E−29    G: 0.000000E+00    H: 0.000000E+00
EC: 100    FC: 100    GC: 100    HC: 100
J: 0.000000E+00
JC: 100

| | | | | | | |
|---|---|---|---|---|---|---|
| 541: | 369.18529 | 21.000000 | | 'CAF2HL' | 100 | 100 |
| 542: | −739.90155 | 1.000000 | | | | |
| 543: | 137.71809 | 39.719231 | | 'CAF2HL' | | |
| 544: | 762.01416 | 15.339626 | | | | |
| 545: | −233.76287 | 10.000000 | | 'CAF2HL' | | |
| 546: | −1034.38004 | 1.000000 | | | | |
| 547: | 151.43369 | 35.374148 | | 'CAF2HL' | | |
| 548: | −21273.43749 | 3.512053 | | | | |
| 549: | 127.02508 | 44.121911 | | 'CAF2HL' | | |
| 550: | −4741.44116 | 12.070337 | | | | |

ASP:
K: 0.000000
IC: YES    CUF: 0.000000
A: 0.948304E−07    B: −.322641E−10    C: −.281077E−13    D: 0.844010E−16
E: −.778064E−19    F: 0.277302E−22    G: 0.000000E+00    H: 0.000000E+00
J: 0.000000E+00

| IMG: | INFINITY | −0.000337 | | | |
|---|---|---|---|---|---|

TABLE 7 wavelength = 157.13 nm

| Object | Radius | Thickness | RMD | Glass sort |
|---|---|---|---|---|
| >OBJ: | INFINITY | 0.000000 | | |
| 601: | INFINITY | 34.000000 | | |
| 602: | 301.23036 | 18.000000 | | 'CAF2HL' |
| 603: | 9024.85717 | 91.000000 | | |

ASP:
K: 0.000000
IC: YES    CUF: 0.000000
A: −.779174E−08    B: 0.228326E−12    C: 0.662071E−17    D: −.278267E−20
E: 0.321230E−24    F: −.133467E−28    G: 0.000000E+00    H: 0.000000E+00
J: 0.000000E+00

| 604: | INFINITY | 372.485723 | | |
|---|---|---|---|---|
| 605: | INFINITY | 0.000000 | | |
| 606: | 329.24390 | 22.000000 | | 'CAF2HL' |

TABLE 7-continued wavelength = 157.13 nm

| Object | Radius | Thickness RMD | Glass sort | | |
|---|---|---|---|---|---|
| 607: | 710.76999 | 19.293465 | | | |
| 608: | −293.87906 | 13.000000 | 'CAF2HL' | | |
| 609: | −968.05522 | 32.145450 | | | |
| 610: | −127.26575 | 14.000000 | 'CAF2HL' | | |
| 611: | −404.63828 | 12.941473 | | | |
| 612: | INFINITY | 0.000010 REFL | | | |
| 613: | 219.31121 | 12.941473 REFL | | | |
| 614: | 404.63828 | 14.000000 | 'CAF2HL' | | |
| 615: | 127.26575 | 32.145450 | | | |
| 616: | 968.05522 | 13.000000 | 'CAF2HL' | | |
| 617: | 293.87906 | 19.293465 | | | |
| 618: | −710.76999 | 22.000000 | 'CAF2HL' | | |
| 619: | −329.24390 | 0.000000 | | | |
| 620: | INFINITY | 369.485723 | | | |
| 621: | INFINITY | 95.013130 | | | |
| 622: | INFINITY | 60.000000 | | | |
| 623: | INFINITY | −0.037541 | | | |
| 624: | 1056.88268 | 35.000000 | 'CAF2HL' | | |
| 625: | −406.34822 | 175.000000 | | | |
| 626: | −271.71671 | 20.000000 | 'CAF2HL' | | |
| 627: | −344.24640 | 1.000000 | | | |
| 628: | 766.12486 | 32.000000 | 'CAF2HL' | | |
| 629: | −1402.78472 | 10.220682 | | | |
| 630: | 385.79357 | 35.000041 | 'CAF2HL' | | |
| 631: | 559.31200 | 341.919072 | | | |

ASP:
K: 0.000000
IC: YES          CUF: 0.000000
A: 0.430988E−08   B: 0.579328E−14   C: 0.860442E−18   D: −.644328E−22
E: 0.362692E−26   F: −.705924E−31   G: 0.000000E+00   H: 0.000000E+00
J: 0.000000E+00

| | | | | | |
|---|---|---|---|---|---|
| 632: | 232.53878 | 14.999813 | 'CAF2HL' | | |
| 633: | 151.97593 | 32.488787 | | | |
| 634: | 240.71208 | 32.000000 | 'CAF2HL' | | |
| 635: | 2495.46807 | 115.579649 | | 100 | 100 |
| STO: | INFINITY | −10.161100 | | 100 | 100 |
| 636: | 153.92754 | 19.621815 | 'CAF2HL' | 100 | 100 |
| 637: | 131.56320 | 5.507542 | | 100 | 100 |

ASP:
K: 0.000000          KC: 100
IC: YES          CUF: 0.000000          CCF: 100
A: 0.298130E−07   B: 0.555237E−12   C: 0.829224E−17   D: 0.102908E−20
AC: 100           BC: 100           CC: 100           DC: 100
E: −.519344E−24   F: 0.690328E−28   G: 0.000000E+00   H: 0.000000E+00
EC: 100           FC: 100           GC: 100           HC: 100
J: 0.000000E+00
JC: 100

| | | | | | |
|---|---|---|---|---|---|
| 639: | 132.44534 | 30.378652 | 'CAF2HL' | 100 | 100 |
| 640: | 1119.94416 | 20.794473 | | | |
| 641: | 120.32786 | 33.748154 | 'CAF2HL' | | |
| 642: | −709.67342 | 11.965434 | | | |
| 643: | −214.74768 | 7.500000 | 'CAF2HL' | | |
| 644: | 3292.43700 | 1.000000 | | | |
| 645: | 108.37386 | 35.374148 | 'CAF2HL' | | |
| 646: | 453.20106 | 1.000000 | | | |
| 647: | 118.78841 | 36.324916 | 'CAF2HL' | | |
| 648: | −564.84518 | 12.070427 | | | |

ASP:
K: 0.000000
IC: YES          CUF: 0.000000
A: 0.192521E−06   B: −.249999E−10   C: −.634108E−13   D: 0.147998E−15
E: −.127297E−18   F: 0.406332E−22   G: 0.000000E+00   H: 0.000000E+00
J: 0.000000E+00

| | | | |
|---|---|---|---|
| IMG: | INFINITY | −0.000427 | |

TABLE 8 wavelength = 157.13 nm

| Object | Radius Radius | Thickness RMD Thickness RMD | Glass sort Glass sort | CCY | THC | GLC |
|---|---|---|---|---|---|---|
| >OBJ: | INFINITY | 0.000000 | | 100 | 100 | |
| 701: | INFINITY | 34.000000 | | 100 | 100 | |
| 702: | 276.26597 | 35.000000 | 'CAF2HL' | 0 | 100 | |
| 703: | 1021.75438 | 95.000000 | | 0 | 100 | |

ASP:
K: 0.000000    KC: 100
IC: YES    CUF: 0.000000    CCF: 100
A: −.148017E−07   B: 0.447070E−12   C: 0.503629E−18   D: −.232159E−20
AC: 0    BC: 0    CC: 0    DC: 0
E: 0.232819E−24   F: −.764889E−29   G: 0.000000E+00   H: 0.000000E+00
EC: 0    FC: 0    GC: 100    HC: 100
J: 0.000000E+00
JC: 100

| | | | | | | |
|---|---|---|---|---|---|---|
| 704: | INFINITY | 423.855836 | | 100 | 0 | |
| 705: | INFINITY | 0.000000 | | 100 | 100 | |
| 706: | 372.37592 | 22.000000 | 'CAF2HL' | 0 | 100 | |
| 707: | 668.85257 | 37.501319 | | 0 | 0 | |
| 708: | −230.27740 | 13.000000 | 'CAF2HL' | 0 | 100 | |
| 709: | −2918.43592 | 38.093680 | | 0 | 0 | |
| 710: | −184.07315 | 14.000000 | 'CAF2HL' | 0 | 100 | |
| 711: | −413.16131 | 19.545452 | | 0 | 0 | |
| 712: | INFINITY | 0.000010 | REFL | 100 | 100 | |
| 713: | 248.15084 | 19.545452 | REFL | 0 | PIK | |
| 714: | 413.16131 | 14.000000 | 'CAF2HL' | PIK | PIK | |
| 715: | 184.07315 | 38.093680 | | PIK | PIK | |
| 716: | 2918.43592 | 13.000000 | 'CAF2HL' | PIK | PIK | |
| 717: | 230.27740 | 37.501319 | | PIK | PIK | |
| 718: | −668.85257 | 22.000000 | 'CAF2HL' | PIK | PIK | |
| 719: | −372.37592 | 0.000000 | | PIK | PIK | |
| 720: | INFINITY | 405.855836 | | 100 | PIK | |
| 721: | INFINITY | 27.000000 | | 100 | 100 | |
| 722: | INFINITY | 10.680479 | | 100 | HMY | |
| 723: | INFINITY | 60.000000 | | 100 | 100 | |
| 724: | INFINITY | 0.000000 | | 100 | 100 | |
| 725: | 434.25844 | 35.000000 | 'CAF2HL' | 0 | 100 | |
| 726: | −397.82211 | 175.000000 | | 0 | 100 | |
| 727: | −156.64549 | 20.000000 | 'CAF2HL' | 0 | 100 | |

ASP:
K: 0.000000    KC: 100
IC: YES    CUF: 0.000000    CCF: 100
A: 0.114541E−07   B: 0.514029E−12   C: −.658251E−17   D: 0.191605E−20
AC: 0    BC: 0    CC: 0    DC: 0
E: 0.683757E−25   F: 0.000000E+00   G: 0.000000E+00   H: 0.000000E+00
EC: 0    FC: 100    GC: 100    HC: 100
J: 0.000000E+00
JC: 100

| | | | | | | |
|---|---|---|---|---|---|---|
| 728: | −245.97649 | 1.000000 | | 0 | 100 | |
| 729: | 461.23130 | 40.000000 | 'CAF2HL' | 0 | 0 | |

ASP:
K: 0.000000    KC: 100
IC: YES    CUF: 0.000000    CCF: 100
A: −.101414E−07   B: 0.110548E−12   C: 0.186983E−16   D: −.170111E−20
AC: 0    BC: 0    CC: 0    DC: 0
E: 0.216455E−25   F: 0.000000E+00   G: 0.000000E+00   H: 0.000000E+00
EC: 0    FC: 100    GC: 100    HC: 100
J: 0.000000E+00
JC: 100

| | | | | | | |
|---|---|---|---|---|---|---|
| 730: | 4028.48297 | 10.220682 | | 0 | 100 | |
| 731: | 421.79876 | 35.000041 | 'CAF2HL' | 0 | 100 | |
| 732: | 1133.21969 | 323.036498 | | 0 | 0 | |

ASP:
K: 0.000000    KC: 100
IC: YES    CUF: 0.000000    CCF: 100
A: 0.673083E−08   B: 0.150516E−12   C: 0.722292E−17   D: 0.630701E−22
AC: 0    BC: 0    CC: 0    DC: 0
E: −.506831E−25   F: 0.126917E−29   G: 0.000000E+00   H: 0.000000E+00
EC: 0    FC: 0    GC: 100    HC: 100
J: 0.000000E+00
JC: 100

| | | | | | | |
|---|---|---|---|---|---|---|
| 733: | 195.44558 | 14.999813 | 'CAF2HL' | 0 | 100 | |
| 734: | 143.55672 | 24.205075 | | 0 | 0 | |

TABLE 8-continued wavelength = 157.13 nm

| Object | Radius Radius | Thickness RMD Thickness RMD | Glass sort Glass sort | CCY | THC | GLC |
|---|---|---|---|---|---|---|
| 735: | 263.40415 | 39.902984 | 'CAF2HL' | 0 | 0 | |
| 736: | −1526.30319 | 3.439634 | | 0 | 0 | |
| 737: | 167.78607 | 29.120237 | 'CAF2HL' | 0 | 0 | |
| 738: | 403.43077 | 13.299521 | | 0 | 0 | |

ASP:
K: 0.000000   KC: 100
IC: YES   CUF: 0.000000   CCF: 100
A: 0.213702E−07   B: −.256444E−12   C: 0.855972E−17   D: −.404743E−20
AC: 0   BC: 0   CC: 0   DC: 0
E: 0.309335E−24   F: −.169687E−28   G: 0.000000E+00   H: 0.000000E+00
EC: 0   FC: 0   GC: 100   HC: 100
J: 0.000000E+00
JC: 100

| STO: | INFINITY | 29.339697 | | 100 | 0 | |
| 740: | −259.64858 | 30.669679 | 'CAF2HL' | 0 | 0 | |
| 741: | −231.31755 | 1.374343 | | 0 | 0 | |

ASP:
K: 0.000000   KC: 100
IC: YES   CUF: 0.000000   CCF: 100
A: 0.247745E−07   B: −.143625E−11   C: 0.149412E−15   D: −.103761E−19
AC: 0   BC: 0   CC: 0   DC: 0
E: 0.440576E−24   F: 0.000000E+00   G: 0.000000E+00   H: 0.000000E+00
EC: 0   FC: 100   GC: 100   HC: 100
J: 0.000000E+00
JC: 100

| 742: | 365.96245 | 51.763916 | 'CAF2HL' | 0 | 0 | |

ASP:
K: 0.000000   KC: 100
IC: YES   CUF: 0.000000   CCF: 100
A: −.233481E−08   B: −.114992E−11   C: 0.787872E−16   D: −.817596E−20
AC: 0   BC: 0   CC: 0   DC: 0
E: 0.190478E−24   F: 0.000000E+00   G: 0.000000E+00   H: 0.000000E +00
EC: 0   FC: 100   GC: 100   HC: 100
J: 0.000000E+00
JC: 100

| 743: | −578.98949 | 1.500000 | | 0 | 100 | |
| 744: | 134.74918 | 36.384686 | 'CAF2HL' | 0 | 0 | |
| 745: | 163.80998 | 0.500000 | | 0 | 100 | |

ASP:
K: 0.000000   KC: 100
IC: YES   CUF: 0.000000   CCF: 100
A: −.322326E−07   B: 0.819328E−11   C: 0.316811E−15   D: 0.370077E−19
AC: 0   BC: 0   CC: 0   DC: 0
E: 0.552969E−25   F: 0.000000E+00   G: 0.000000E+00   H: 0.000000E+00
EC: 0   FC: 100   GC: 100   HC: 100
J: 0.000000E+00
JC: 100

| 746: | 105.20708 | 35.374148 | 'CAF2HL' | 0 | 100 | |
| 747: | 2493.20162 | 1.000000 | | 0 | 100 | |
| 748: | 357.29743 | 36.324916 | 'CAF2HL' | 0 | 100 | |
| 749: | −759.96556 | 12.069863 | | 0 | PIM | |

ASP:
K: 0.000000   KC: 100
IC: YES   CUF: 0.000000   CCF: 100
A: 0.364257E−07   B: 0.139300E−10   C: −.141126E−13   D: 0.677942E−17
AC: 0   BC: 0   CC: 0   DC: 0
E: −.780604E−21   F: −196532E−24   G: 0.000000E+00   H: 0.000000E+00
EC: 0   FC: 0   GC: 100   HC: 100
J: 0.000000E+00
JC: 100

| IMG: | INFINITY | 0.000137 | | 100 | 0 | |

TABLE 9 wavelength = 157.13 nm

| Object | Radius | Thickness | RMD | Glass sort | CCY | THC | GLC |
|---|---|---|---|---|---|---|---|
| OBJ: | INFINITY | 0.000000 | | | 100 | 100 | |
| 801: | INFINITY | 34.000000 | | | 100 | 100 | |
| 802: | 251.38730 | 38.497396 | | 'CAF2HL' | 0 | 0 | |
| 803: | 603.00415 | 90.000000 | | | 0 | 100 | |

ASP:
K: 0.000000    KC: 100
IC: YES    CUF: 0.000000    CCF: 100
A: −.124195E−07  B: −.201050E−12  C: 0.136116E−17    D: −.369989E−21
AC: 0    BC: 0    CC: 0    DC: 0
E: 0.571614E−25  F: −.300137E−29  G: 0.000000E+00    H: 0.000000E+00
EC: 0    FC: 0    GC: 100    HC: 100
J: 0.000000E+00
JC: 100

| | | | | | | | |
|---|---|---|---|---|---|---|---|
| 804: | INFINITY | 460.459734 | | | 100 | 0 | |
| 805: | INFINITY | 0.000000 | | | 100 | 100 | |
| 806: | −258.59640 | 22.000000 | | 'CAF2HL' | 0 | 100 | |
| 807: | −515.99269 | 26.483445 | | | 0 | 0 | |
| 808: | −403.63140 | 13.000000 | | 'CAF2HL' | 0 | 100 | |
| 809: | −928.08447 | 37.951900 | | | 0 | 0 | |
| 810: | −173.01949 | 14.000000 | | 'CAF2HL' | 0 | 100 | |
| 811: | −289.04453 | 3.607524 | | | 0 | 0 | |

ASP:
K: 0.000000    KC: 100
IC: YES    CUF: 0.000000    CCF: 100
A: −.439665E−08  B: 0.442003E−13  C: 0.181557E−17    D: −.148322E−21
AC: 0    BC: 0    CC: 0    DC: 0

| | | | | | | | |
|---|---|---|---|---|---|---|---|
| 812. | INFINITY | 0.000010 | REFL | | 100 | 100 | |
| 813. | 267.30150 | 3.607524 | REFL | | 0 | PIK | |

ASP:
K: 0.000000    KC: 100
IC: YES    CUF: 0.000000    CCF: 100
A: −.214071E−08  B: 0.147481E−13  C: 0.128674E−17    D: −.843005E−22
AC: 0    BC: 0    CC: 0    DC: 0

| | | | | | | | |
|---|---|---|---|---|---|---|---|
| 814: | 289.04453 | 14.000000 | | 'CAF2HL' | PIK | PIK | |

ASP:
K: 0.000000    KC: 100
IC: YES    CUF: 0.000000    CCF: 100
A: 0.439665E−08  B: −.442003E−13  C: −181557E−17    D: 0.148322E−21
AC: PIK    BC: PIK    CC: PIK    DC: PIK

| | | | | | | | |
|---|---|---|---|---|---|---|---|
| 815: | 173.01949 | 37.951900 | | | PIK: | PIK | |
| 816: | 928.08447 | 13.000000 | | 'CAF2HL' | PIK | PIK | |
| 817: | 403.63140 | 26.483445 | | | PIK | PIK | |
| 818: | 515.99269 | 22.000000 | | 'CAF2HL' | PIK | PIK | |
| 819: | 258.59640 | 0.000000 | | | PIK | PIK | |
| 820: | INFINITY | 447.459734 | | | 100 | PIK | |
| 821: | INFINITY | 60.000000 | | | 100 | 100 | |
| 822: | INFINITY | 15.356414 | | | 100 | HMY | |
| 823: | INFINITY | 40.000000 | | | 100 | 100 | |
| 824: | INFINITY | 0.000000 | | | 100 | 100 | |
| 825: | 633.39437 | 35.000000 | | 'CAF2HL' | 0 | 100 | |
| 826: | −347.37162 | 119.686124 | | | 0 | 0 | |
| 827: | −211.26446 | 20.000000 | | 'CAF2HL' | 0 | 100 | |
| 828: | −237.58727 | 1.055156 | | | 0 | 0 | |
| 829: | 550.08434 | 40.000000 | | 'CAF2HL' | 0 | 0 | |
| 830: | −612.80061 | 40.249917 | | | 0 | 0 | |
| 831: | −201.71052 | 35.000000 | | 'CAF2HL' | 0 | 100 | |
| 832: | −322.70560 | 321.354243 | | | 0 | 0 | |
| 833: | −585.62058 | 9.084229 | | 'CAF2HL' | 0 | 0 | |
| 834: | 367.59560 | 18.890606 | | | 0 | 0 | |

ASP:
K: 0.000000    KC: 100
IC: YES    CUF: 0.000000    CCF: 100
A: 0.290547E−07  B: −.169007E−12  C: −.334287E−17    D: 0.420422E−21
AC: 0    BC: 0    CC: 0    DC: 0

| | | | | | | | |
|---|---|---|---|---|---|---|---|
| 835: | 1167.44840 | 32.000000 | | 'CAF2HL' | 0 | 100 | |
| 836: | −274.28444 | 43.654547 | | | 0 | 0 | |
| 837: | 189.47888 | 45.000000 | | 'CAF2HL' | 0 | 0 | |
| 838: | 724.11587 | 12.838681 | | | 0 | 0 | |
| STO: | INFINITY | 29.998948 | | | 100 | 0 | |
| 840: | 299.02718 | 33.232875 | | 'CAF2HL' | 0 | 0 | |
| 841: | 1469.50622 | 12.574830 | | | 0 | 0 | |

TABLE 9-continued wavelength = 157.13 nm

| Object | Radius | Thickness | RMD | Glass sort | CCY | THC | GLC |
|---|---|---|---|---|---|---|---|
| 842: | 161.10860 | 31.660134 | | 'CAF2HL' | 0 | 0 | |
| 843: | 1679.93121 | 12.291388 | | | 0 | 0 | |
| 844: | -1595.69234 | 44.999319 | | 'CAF2HL' | 0 | 0 | |

ASP:
K: 0.000000    KC: 100
IC: YES    CUF: 0.000000    CCF: 100
A: -.831600E-07   B: 0.176877E-12   C: 0.802277E-16   D: -.176968E-20
AC: 0    BC: 0    CC: 0    DC: 0

| | | | | | | | |
|---|---|---|---|---|---|---|---|
| 845: | -574.39812 | 1.000000 | | | 100 | 100 | |
| 846: | 105.01287 | 35.374148 | | 'CAF2HL' | 100 | 100 | |
| 847: | 447.38323 | 1.000000 | | | 100 | 100 | |
| 848: | 518.28016 | 36.324916 | | 'CAF2HL' | 100 | 100 | |
| 849: | -590.37066 | 12.070070 | | | 0 | PIM | |

ASP:
K: 0.000000    KC: 100
IC: YES    CUF: 0.000000    CCF: 100
A: 0.117497E-06   B: -.225496E-10   C: 0.111640E-13   D: -.286686E-17
AC: 0    BC: 0    CC: 0    DC: 0

| IMG: | INFINITY | -0.000069 | | | 100 | 0 | |

TABLE 10 wavelength = 157.83 nm

| Object Reference number | Radius Radius RDY | Thickness RMD Thickness THI | RMD | Glass sort Glass material GLA |
|---|---|---|---|---|
| OBJ: | INFINITY | 34.000000 | | |
| 1: | INFINITY | 4.000000 | | |
| 1002: | 312.33717 | 18.000000 | | 'CAF2' |
| 1003: | 9682.90099 | 83.000000 | | |
| 1004: | INFINITY | 0.000000 | REFL | |

XDE: 0.000000    YDE: 0.000000    ZDE: 0.000000    BEN
ADE: 52.000000   BDE: 0.000000    CDE: 0.000000

| 5: | INFINITY | -414.787259 | | |
| 1006: | -405.55295 | -22.000000 | | 'CAF2' |
| 1007: | -2462.67101 | -41.116913 | | |
| 1008: | 203.79683 | -13.000000 | | 'CAF2' |
| 1009: | 1424.67172 | -33.321295 | | |
| 1010: | 176.13502 | -14.000000 | | 'CAF2' |
| 1011: | 480.49454 | -16.561783 | | |
| 1012: | 241.21296 | 16.561783 | REFL | |
| 13: | 480.49454 | 14.000000 | | 'CAF2' |
| 14: | 176.13502 | 33.321295 | | |
| 15: | 1424.67172 | 13.000000 | | 'CAF2' |
| 16: | 203.79683 | 41.116913 | | |
| 17: | -2462.67101 | 22.000000 | | 'CAF2' |
| 18: | -405.55295 | 409.787259 | | |
| 19: | INFINITY | 0.000000 | | |
| 1020: | INFINITY | -70.541305 | REFL | |

XDE: 0.000000    YDE: 0.000000    ZDE: 0.000000    BEN
ADE: 38.000000   BDE: 0.000000    CDE: 0.000000

| IMI 21: | INFINITY | -59.941156 | | |
| 1022: | -190.01878 | -20.601459 | | 'CAF2' |

ASP:
K: 0.000000
IC: YES    CUF: 0.000000
A: 0.141974E-07   B: 0.103665E-12   C: 0.352915E-16
D: -.784951E-21   E: 0.116720E-24   F: -.256130E-29
G: 0.000000E-00   H: 0.000000E+00   J: 0.000000E+00

| 1023: | -179.90446 | -6.322544 | | |
| 1024: | -210.09796 | -39.346550 | | 'CAF2' |

ASP:
K: 0.000000
IC: YES    CUF: 0.000000

TABLE 10-continued wavelength = 157.83 nm

| Object Reference number | Radius Radius RDY | Thickness RMD Thickness THI | RMD | Glass sort Glass material GLA |
|---|---|---|---|---|

A: 0.767825E-10   B: 0.128720E-13   C: -.336180E-16
D: 0.379837E-21   E: -.119676E-24   F: 0.186053E-29
G: 0.000000E+00   H: 0.000000E+00   J: 0.000000E+00

| 1025: | 473.11548 | -103.837418 | | |
| 1026: | 3696.82552 | -15.000000 | | 'CAF2' |

ASP:
K: 0.000000
IC: YES    CUF: 0.000000
A: 0.254112E-07   B: -.369099E-12   C: -.152523E-16
D: -.211663E-22   E: 0.393483E-25   F: -.220459E-31
G: 0.000000E+00   H: 0.000000E+00   J: 0.000000E+00

| 1027: | -1457.62061 | -116.883653 | | |
| 1028: | 245.07294 | -15.478383 | | 'CAF2' |
| 1029: | 470.01593 | -119.415520 | | |

ASP:
K: 0.000000
IC: YES    CUF: 0.000000
A: 0.248698E-08   B: -.133539E-11   C: -.100200E-16
D: -.278441E-21   E: -.245690E-25   F: 0.118955E-29
G: 0.000000E+00   H: 0.000000E+00   J: 0.000000E+00

| 1030: | -211.14451 | -46.407461 | | 'CAF2' |
| 1031: | 390.08349 | -41.599722 | | |
| 1032: | 214.84948 | -15.000000 | | 'CAF2' |
| 1033: | -152.90981 | -22.009325 | | |

ASP:
K: 0.000000
IC: YES    CUF: 0.000000
A: -.671886E-07   B: 0.227147E-11   C: 0.653352E-16
D: 0.531753E 21   E: -.466831E-25   F: 0.184559E-29
G: 0.000000E+00   H: 0.000000E+00   J: 0.000000E+00

| 1034: | -456.24753 | -36.555361 | | |
| 1035: | 231.78386 | -1.000000 | | |
| 1036: | 3335.79137 | -13.249069 | | 'CAF2' |
| 1037 | 798.41900 | -1.000000 | | |
| STO: | INFINITY | -4.032535 | | |
| 1039: | -158.37404 | -46.695487 | | 'CAF2' |
| 1040: | -287.83268 | -0.999916 | | |
| 1041: | -174.28171 | -11.999877 | | 'CAF2' |
| 1042: | -127.11599 | -15.767825 | | |

ASP:
K: 0.000000
IC: YES    CUF: 0.000000

TABLE 10-continued wavelength = 157.83 nm

| Object Reference number | Radius Radius RDY | Thickness RMD Thickness THI | RMD | Glass sort Glass material GLA |
|---|---|---|---|---|
| A: −.171361E−07 | B: −.218987E 11 | C: −.745527E−16 | | |
| D: −.678130E−20 | E: 0.949579E−24 | F: −.111046E−27 | | |
| G: 0.000000E+00 | H: 0.000000E+00 | J: 0.000000E+00 | | |
| 1043: | −215.90706 | −41.405295 | | 'CAF2' |
| 1044: | 241.65885 | −1.000000 | | |
| 1045: | −92.14326 | −44.385959 | | 'CAF2' |
| 1046: | −251.19562 | −2.210034 | | |
| ASP: | | | | |
| K: 0.000000 | | | | |
| IC: YES | CUF: 0.000000 | | | |
| A: 0.901760E−07 | B: −.301574E−11 | C: −.132486E−14 | | |
| D: 0.194427E−18 | E: 0.127620E−22 | F: −.272720E−27 | | |
| G: 0.000000E+00 | H: 0.000000E+00 | J: 0.000000E+00 | | |
| 1047: | −163.12030 | −46.650069 | | 'CAF2' |
| 48: | INFINITY | 0.000000 | | 'CAF2' |
| 1049: | 551.37429 | 0.000000 | | |
| ASP: | | | | |
| K: 0.000000 | | | | |
| IC: YES | CUF: 0.000000 | | | |
| A: −.743735E−07 | B: −.149540E−10 | C: 0.934774E−15 | | |
| D: −.100734E−16 | E: 0.533395E−20 | F: −.149893E−23 | | |
| G: 0.000000E+00 | H: 0.000000+00 | J: 0.000000E+00 | | |
| 50: | INFINITY | −6.000000 | | 'CAF2' |
| 51: | INFINITY | −11.999873 | | |
| IMG: | INFINITY | | | |

What is claimed is:

1. A projection exposure lens comprising:
   an object plane,
   an optical element for separating beams,
   a concave mirror,
   an image plane,
   a first lens system arranged between the object plane and the optical elements for separating beams,
   a second double passed lens system arranged between the optical elements for separating beams and the concave mirror,
   a third lens system arranged between the optical elements for separating beams and the image plane,
   wherein
      at least one of the lens or mirror surfaces of the first, second or third lens system is aspheric and the numerical aperture NA of the projection exposure lens is 0.7 or greater, with a maximum image height exceeding 10 mm.

2. The projection exposure lens according to claim 1, wherein the numerical aperture of the projection exposure lens is 0.8 or greater.

3. The projection exposure lens according to claim 1, wherein the second lens system comprises a maximum of five lenses.

4. A projection exposure apparatus comprising:
   a UV-laser light source,
   an illuminating system,
   a mask handling and positioning system,
   a projection exposure lens according to claim 1, and
   a wafer handling and positioning system.

5. A method of producing microstructured devices by lithography comprising the step of using a projection exposure apparatus comprising:
   an illuminating system,
   a mask handling and positioning system,
   a projection exposure lens according to claim 1, and
   a wafer handling and positioning system.

6. The method according to claim 5, wherein use is made of at least one of step- and repeat, scanning or stitching exposure schemes.

7. A projection exposure lens comprising:
   an object plane,
   an optical element for separating beams,
   a concave mirror,
   an image plane,
   a first lens system arranged between the object plane and the optical elements for separating beams,
   a second double pass lens system arranged between the optical elements for separating beams and the concave mirror,
   a third lens system arranged between the optical elements for separating beams and the image plane,
   wherein
      the second lens system comprises a maximum of five lenses and two lenses are negative lenses.

8. The projection exposure lens according to claim 7, wherein
   the distance between the vertices of the two lenses of the second lens system is smaller than 0.6 diameter of the concave mirror.

9. The projection exposure lens according to claim 8, wherein the distance between the vertices of the two lenses of the second lens system is smaller than 0.5 diameter of the concave mirror.

10. The projection exposure lens according to claim 7, wherein the projection exposure lens comprises an aperture stop and the diameter of each of the two lenses is greater than 1.1 diameter of the aperture stop.

11. The projection exposure lens according to claim 7, wherein the distance between the optical elements for separating beams and the first of the two lenses of the second lens system is greater than 1.5 of the diameter of said lens.

12. The projection exposure lens according to claim 11, wherein the distance between the optical elements for separating beams and the first of the two lenses is greater than 1.8 times the diameter of said lens.

13. The projection exposure lens according to claim 7, wherein the optical elements for separating beams comprise a beam splitter.

14. The projection exposure lens according to claim 7, wherein the optical elements for separating beams comprise a folding mirror.

15. The projection exposure lens according to claim 7, wherein the optical elements for separating beams comprise two folding mirrors.

16. The projection exposure lens according to claim 15, wherein the two folding mirrors comprise internal surfaces of a prism.

17. The projection exposure lens according to claim 16, wherein a material of the prism has a refractive index greater than 1.4.

18. The projection exposure lens according to claim 16, wherein a material of the prism has an expansion coefficient smaller than $10^{-6}$ $K^{-1}$ in a temperature region −20° C. to +300° C.

19. The projection exposure lens according to claim 15, wherein the folding mirrors comprise surfaces that are coated with reflection enhancing thin films.

20. The projection exposure lens according to claim 15, wherein the folding mirrors comprise at least one aspheric surface.

21. The exposure system according to claim 7, wherein the second lens system and the concave mirror are arranged along an unfolded optical axis.

22. The projection exposure lens according to claim 21, wherein the first lens system comprises a first optical axis, the optical elements for separating beams comprise a folding mirror,
and the folding mirror is arranged at a place where the optical axis of the first lens system and the unfolded optical axis of the second lens system and the concave mirror crosses.

23. The projection exposure lens according to claim 7, wherein an object in the object plane is imaged by the first and the second lens system into an intermediate image.

24. The projection exposure lens according to claim 23, wherein a plane in which the intermediate image is situated is accessible.

25. The projection exposure lens according to claim 24, wherein a field stop is located a field stop is located in the plane in which the intermediate image is situated.

26. The projection exposure lens according to claim 7, wherein the intermediate image is situated between the optical elements for separating the beams and a first lens in a beam path from the object plane to the image plane of the third lens system.

27. The projection exposure lens according to claim 7, wherein the third lens system comprises an aperture stop.

28. The projection exposure lens according to claim 27, wherein the third lens system comprises a space without lenses located between an intermediate image and the aperture stop.

29. The projection exposure lens according to claim 28, wherein the space without lenses between an intermediate image and the aperture stop is greater than 25% of a distance between the optical elements for separating beams and the image plane.

30. The projection exposure lens according to claim 28; wherein the lenses of the third lens system are densely packed between the aperture stop and the image plane.

31. The projection exposure lens according to claim 7, wherein a subsystem composed of the second double passed lens system and the concave mirror comprises an aspheric surface.

32. The projection exposure lens according to claim 31, wherein a lens situated in the second double passed lens system next to the concave mirror comprises an aspheric surface.

33. The projection exposure lens according to claim 32, wherein the concave mirror comprises an aspheric surface.

34. The projection exposure lens according to claim 32, wherein the lens is situated in the second double passed lens system next to the concave mirror comprises an aspheric surface, said aspheric surface is situated opposite to the surface of the concave mirror.

35. The projection exposure lens according to claim 34, wherein the concave mirror comprises an aspheric surface.

36. The projection exposure lens according to claim 31, wherein an aperture stop is situated in the third lens system and the condition h/Φ>1.2 for one or more of the aspheric surfaces is fulfilled, where h is the height at each lens surface of a light beam that is assumed to be emitted from an intersection of an optical axis of the object plane and passes through the lens surface with a maximum numerical aperture and Φ is the radius of the aperture stop in the third lens group.

37. The projection exposure lens according to claim 7, wherein at least one surface of lenses situated in the third lens system comprises an aspheric surface.

38. The projection exposure lens according to claim 37, wherein the third lens system comprises an aperture stop arid at least one of the aspheric surfaces of the Lenses of the third lens system is located in a light path from the object plane to the image plane before the aperture stop and at least one aspheric surface in the light path behind the aperture stop.

39. The projection exposure lens according to claim 37, wherein one of the surface of the lens next to the image plane is aspheric.

40. The projection exposure lens according to claim 7, wherein all lenses of the projection exposure lens are made of the same material.

41. The projection exposure lens according to claim 40, wherein the material is selected from quartz glass, LIF, $CaF_2$, $BaF_2$ or another fluoride crystal.

42. The projection exposure lens according to claim 41, wherein depending on the wavelength of light traveling through the projection exposure lens the following material is used:

$180<\lambda<250$ nm: quanz or $CaF_2$ $120<\lambda<180$ nm: $CaF_2$, or $BaF_2$.

43. The projection exposure lens according to claim 7, wherein the lenses are made of a first material and of a second material, and no more than four lenses are made of the second material, and the second material is differs from the first material.

44. The projection exposure lens according to claim 43, wherein the lenses are made of a first material and of a second material, wherein no more than three lenses are made of the second material, and the second material differs from the first material.

45. The projection exposure lens according to claim 43, wherein the first and second material is selected from quartz glass, LIF, $CaF_2$, $BaF_2$ or another fluoride crystal.

46. The projection exposure lens according to claim 45, wherein depending on the wave length of light traveling through the projection exposure lens the following material for the first and the second material is used:

$180<\lambda<250$ nm: quartz or $CaF_2$ $120<\lambda<180$ nm: $CaF_2$, or $BaF_2$.

47. The projection exposure lens according to claim 7, wherein the third lens system is composed of a field lens group, an intermediate correcting lens group and a focusing lens group.

48. The projection exposure lens according to claim 47, wherein the field lens group is of positive refractive power, the intermediate correcting lens group is of positive or negative refractive power, and the focusing lens group is of positive refractive power.

49. The projection exposure lens according to claim 47, wherein the at least one pair of menisci is arranged in the intermediate correcting lens group.

50. The projection exposure lens according to claim 47, wherein at least two lenses from a −+ power doublet with negative and positive optical power and the −+ power doublet is arranged in the focusing lens group.

51. The projection exposure lens according to claim 7, wherein the third lens system comprises at least one <+ power doublet with a negative power lens and a positive power lens in this sequence seen in the light path from the object plane to the image plane.

52. The projection exposure lens according to claim 51, wherein one of the −+ power doublets is arranged next to the aperture stop in the third lens group.

53. The projection exposure lens according to claim 7, wherein the projection exposure system comprises an intermediate image and an imaging ratio of an object situated in the object plane and imaged into the intermediate image plane is greater than 0.90, and different from unity.

54. The projection exposure lens according to claim 7, wherein the projection exposure system comprises an intermediate image and the third lens system comprises at least a pair of menisci, a convex surface of a first meniscus of the pair of menisci facing towards the intermediate image, and a convex surface of a second meniscus of the pair of menisci facing opposite.

55. The projection exposure lens according to claim 7, wherein the longitudinal chromatic aberration of the projection exposure lens is less than 0.015 $\mu$m per a band width of 1 pm at 193 nm.

56. The projection exposure lens according to claim 7, wherein the longitudinal chromatic aberration of the projection exposure lens is less than 0.05 $\mu$m per band with of 1 pm at 157 nm.

57. The projection exposure lens according to claim 7, wherein the projection exposure lens is telecentric on the image side as well as on the object side.

58. A projection exposure lens comprising:
an object plane,
an optical element for separating beams,
a concave mirror,
an image plane,
a first lens system arranged between the object plane and the optical elements for separating beams,
a second double pass lens system arranged between the optical elements for separating beams and the concave mirror,
a third lens system arranged between the optical elements for separating beams and the image plane,
wherein
the second lens system comprises a maximum of five lenses and wherein at least two lenses are negative lenses.

59. The projection exposure lens according to claim 58, wherein
the three lenses comprise of a first, a second and a third lens and the distance between the vertices of the first and the third lens of the second lens system is smaller than 0.6 diameter of the concave mirror.

60. The projection exposure lens according to claim 59, wherein the distance between the vertices of the first and the third lens of the second lens system is smaller than 0.5 diameter of the concave mirror.

61. The projection exposure lens according to claim 58, wherein the projection exposure lens comprises an aperture stop and the diameter of each of the three lenses is greater than 1.1 diameter of aperture stop.

62. The projection exposure lens according to claim 58, wherein the distance between the optical elements for separating beams and the first of the three lenses of the second lens system is greater than 1.5 times the diameter of said lens.

63. The projection exposure lens according to claim 62, wherein the distance between the optical elements for separating beams and the first of the three lenses is greater than 1.8 times the diameter of said lens.

64. The projection exposure lens according to claim 58, wherein the optical elements for separating beams comprise a beam splitter.

65. The projection exposure lens according to claim 58, wherein the optical elements for separating beams comprise a folding mirror.

66. The projection exposure lens according to claim 58, wherein the optical elements for separating beams comprising two folding mirrors.

67. The projection exposure lens according to claim 66, wherein the two folding mirrors comprise internal surfaces of a prism.

68. The projection exposure lens according to claim 67, wherein a material of the prism has a refractive index greater than 1.4.

69. The projection exposure lens according to claim 68, wherein the prism material has an expansion coefficient smaller than $10^{-6}$ $K^{-1}$ in a temperature region −20° C. to +300° C.

70. The projection exposure lens according to claim 66, wherein the folding mirrors comprise surfaces that are coated with reflection enhancing thin films.

71. The projection exposure lens according to claim 66, wherein the folding mirrors comprise at least one aspheric surface.

72. The projection exposure lens according to claim 58, wherein the second lens system and the concave mirror are arranged along an unfolded optical axis.

73. The projection exposure lens according to claim 72, wherein the first lens system comprises a first optical axis and the optical elements for separating beams comprise a folding mirror, and the folding mirror is arranged at a place where the optical axis of the first lens system and the unfolded optical axis of the second lens system and the concave mirror crosses.

74. The projection exposure lens according to claim 73, wherein the first lens system comprises a first lens, the folding angle between the first optical axis and the unfolded optical axis is defined, the folding angle deviates from 90° such that the lenses of the second lens system and the concave mirror are more distant from the object plane than is the first lens of the first lens system.

75. A projection exposure lens comprising:
an object plane,
optical elements for separating beams,
a concave mirror,
an image plane,
a first lens system arranged between the object plane and the optical elements for separating beams,
a second doable pass lens system arranged between the optical elements for separating beans and the concave mirror,
a third lens system arranged between the optical elements for separating beams and the image plane,
wherein the second lens system comprises a maximum of five lenses and the rms wavefront aberration is less than 20 milliwaves.

76. The projection exposure lens according to claim 75, wherein the rms wavefront aberration is less than 10 milliwaves.

77. A projection exposure lens comprising:
an object plane,
optical elements for separating beams,
a concave mirror, an image plane, a first lens system arranged between the object plane and the optical elements for separating beams, a second lens system arranged comprising a double pass lens system between the optical elements for separating beams and the concave mirror, a third lens system arranged between the optical elements for separating beams and the image plane, wherein the second lens system comprises a maximum of five lenses and the first lens system consists of one lens, wherein one lens of the first lens system is a positive lens, and, wherein the one lens of the first lens system has at least one aspheric surface.

78. A projection exposure lens comprising:

an object plane, optical elements for separating beams, a concave mirror, an image plane, a first lens system arranged between the object plane and the optical elements for separating beams, a second lens system arranged comprising a double pass lens system between the optical elements for separating beams and the concave mirror, a third lens system arranged between the optical elements for separating beams and the image plane, wherein the second lens system comprises a maximum of five lenses and the first lens system consists of one lens, and wherein the optical elements for separating beams comprise two folding mirrors.

* * * * *